United States Patent
Cha et al.

(10) Patent No.: US 7,949,510 B2
(45) Date of Patent: May 24, 2011

(54) DISTRIBUTED SIMULTANEOUS SIMULATION

(75) Inventors: Chi-Ho Cha, Hwaseong-si (KR); Hoon-Sang Jin, Yongin-si (KR); Hyun-Uk Jung, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 987 days.

(21) Appl. No.: 11/747,664

(22) Filed: May 11, 2007

(65) Prior Publication Data
US 2007/0266355 A1   Nov. 15, 2007

(30) Foreign Application Priority Data

May 12, 2006   (KR) ........................ 10-2006-0043082

(51) Int. Cl.
*G06F 17/50* (2006.01)
(52) U.S. Cl. ................ 703/16; 703/17; 703/19; 716/108
(58) Field of Classification Search .............. 703/13–19, 703/23; 716/4–6
See application file for complete search history.

(56) References Cited

U.S. PATENT DOCUMENTS

| | | | | |
|---|---|---|---|---|
| 4,873,630 A | * | 10/1989 | Rusterholz et al. ................ 712/3 |
| 4,945,479 A | * | 7/1990 | Rusterholz et al. ................ 712/3 |
| 5,812,823 A | * | 9/1998 | Kahle et al. ...................... 703/26 |
| 7,171,593 B1 | * | 1/2007 | Whittaker et al. ............... 714/57 |
| 2002/0055828 A1 | * | 5/2002 | Swoboda et al. ............... 703/13 |
| 2004/0249623 A1 | * | 12/2004 | Selvidge et al. ................ 703/23 |
| 2007/0265823 A1 | * | 11/2007 | Cha et al. ........................ 703/24 |

FOREIGN PATENT DOCUMENTS

| | | |
|---|---|---|
| JP | 06-282600 | 10/1994 |
| JP | 10-187790 | 7/1998 |
| JP | 2005-086215 | 3/2005 |
| KR | 1020010114158 | 12/2001 |

OTHER PUBLICATIONS

Wang et al., Z. Area-Efficient High-Speed Decoding Schemes for Turbo Decoders, IEEE Transactions on Very Large Scale Integration (VLSI) Systems, vol. 10, No. 6, Dec. 2002, pp. 902-912.*
English Abstract for Japanese Publication No. 06-28260.
English Abstract for Japanese Publication No. 2005-086215.
English Abstract for Japanese Publication No. 10-187790.
English Abstract for Korean Publicaion No. 1020010114158.

* cited by examiner

*Primary Examiner* — Russell Frejd
(74) *Attorney, Agent, or Firm* — F. Chau & Associates, LLC

(57) ABSTRACT

A method and system for distributed simultaneous simulation are provided, the method including providing a state of at least one storage unit, providing a segment of the circuit bounded by the at least one storage unit, and simulating the segment in accordance with the state of the at least one storage unit; and the system including a memory for describing storage units of a circuit, maintaining states of the storage units, and identifying distributed segments comprising combinational logic separated by the storage units, and processing units, each for simultaneously simulating at least one of the segments in accordance with the maintained states.

34 Claims, 34 Drawing Sheets

Fig. 1

| CLOCK CYCLE | EVENT |
|---|---|
| 1 | Division operation begin(3 cycles to complete) |
| 2 | None |
| 3 | None |
| 4 | Division completes |
| 5 | None |
| 6 | Multiplication event begin(2 cycles to complete) |
| 7 | None |
| 8 | Multiplication event completes |
| 9 | None |
| 10 | None |

Fig. 2

| CLOCK CYCLE | EVENT |
|---|---|
| 1 | Division operation begin(3 cycles to complete) |
| 4 | Division completes |
| 6 | Multiplication event begin(2 cycles to complete) |
| 8 | Multiplication event completes |

| Fig. 4 |
|---|
| Fig. 4A \| Fig. 4B |
| Fig. 4C \| Fig. 4D |

| Cycle \ Storage Unit | f1_a | f2_a | f3_a | f4_a | f5_a | f6_a | f7_a | f8_a |
|---|---|---|---|---|---|---|---|---|
| t1 | 0 | 1 | 1 | 1 | 0 | 1 | 1 | 1 |
| t2 | 1 | 1 | 0 | 1 | 0 | 0 | 1 | 1 |

(a) Extract and save all the states of storage units from the netlist A at cycle t1 and t2 during simulation (b) Restore all the states of storage units to the netlist B at cycle t1

(c) Calculate the next states of storage units in the netlist B (d) Compare the expected states of storage units with the calculated states of the storage units in the netlist B (a) Storage tracer(scanable D F/F and latch)

(b) Net tracer(scanable D F/F and latch with a bypass path
and an additional monitoring port from the D F/F or latch)

(c-1) Original memory (c-2) Memory model for DSS simulation (d-1) User defined storage element or top level (d-2) User defined storage element or top level model for DSS simulation

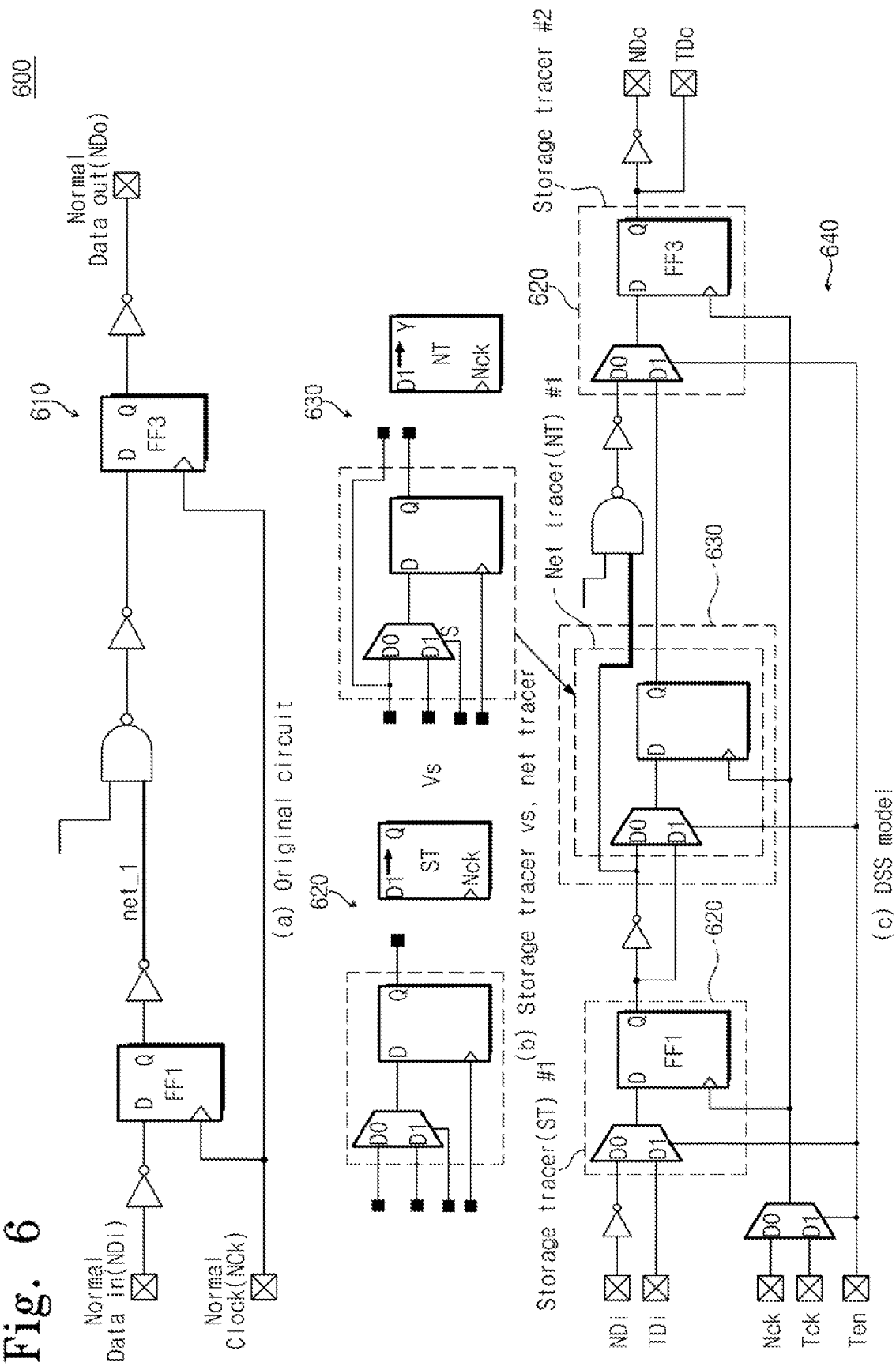

| Fig. 7A | Fig. 7B |

(a) Original user defined storage element for DSS simulation

Fig. 7B
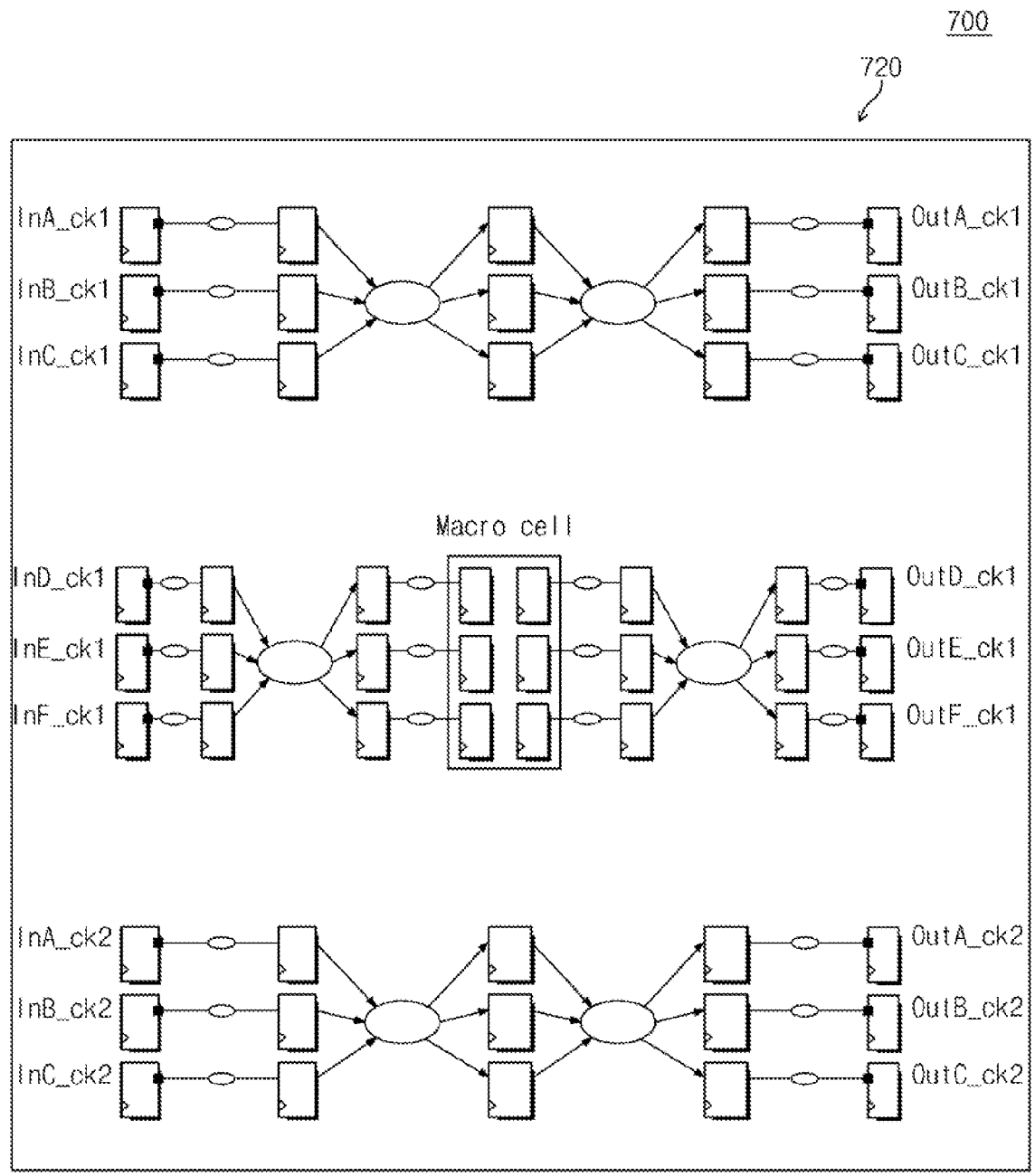
(b) User defined storage element model for DSS simulation

(a) Extract and save all the states of storage units from the netlist A at cycle t1 and t2 during simulation

| Fig. 8 | |
|---|---|
| Fig. 8A | Fig. 8B |
| Fig. 8C | Fig. 8D |

| Storage Unit / Cycle | f1_a | f2_a | f3_a | f4_a | f5_a | f6_a | f7_a | f8_a |
|---|---|---|---|---|---|---|---|---|
| t1 | 0 | 1 | 1 | 1 | 0 | 1 | 1 | 1 |
| t2 | 1 | 1 | 0 | 1 | 0 | 0 | 1 | 1 |

(b) Restore all the states of storage units to the netlist B at cycle t1

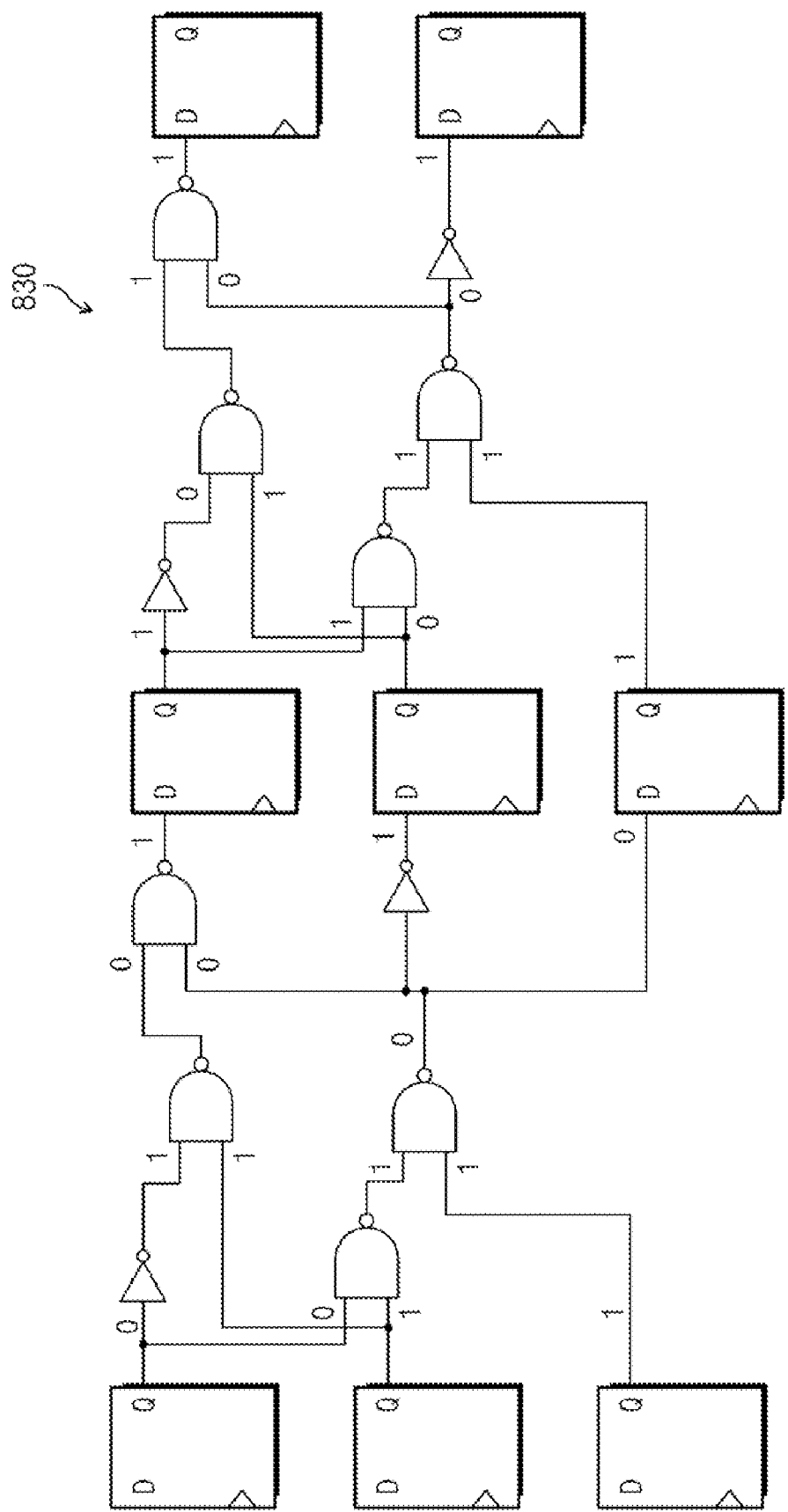

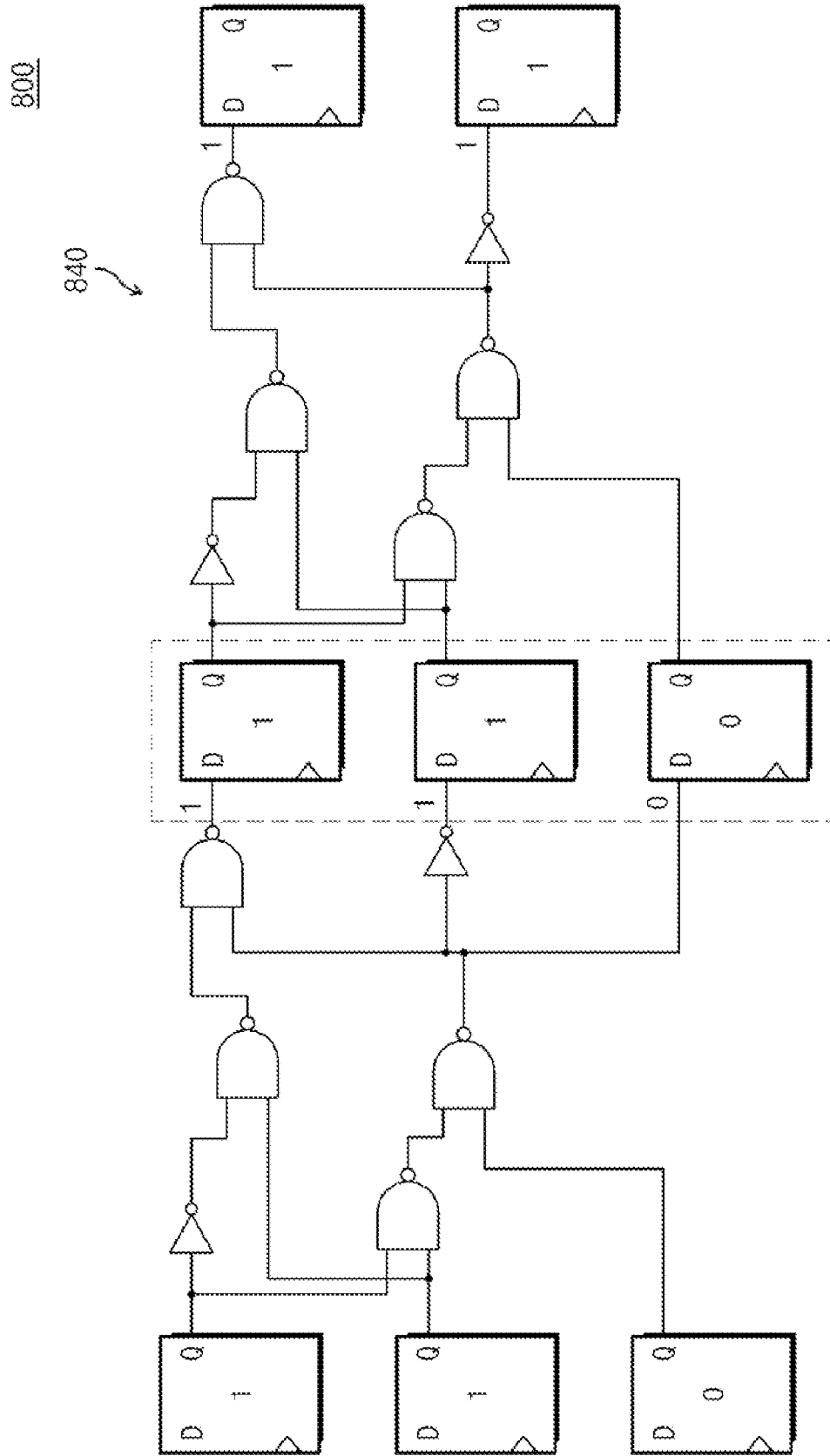

| Fig. 9A | Fig. 9B |

(a) Orginal circuit (b) DSS model for the original with net tracers to make semi-hard segments from the original circuit

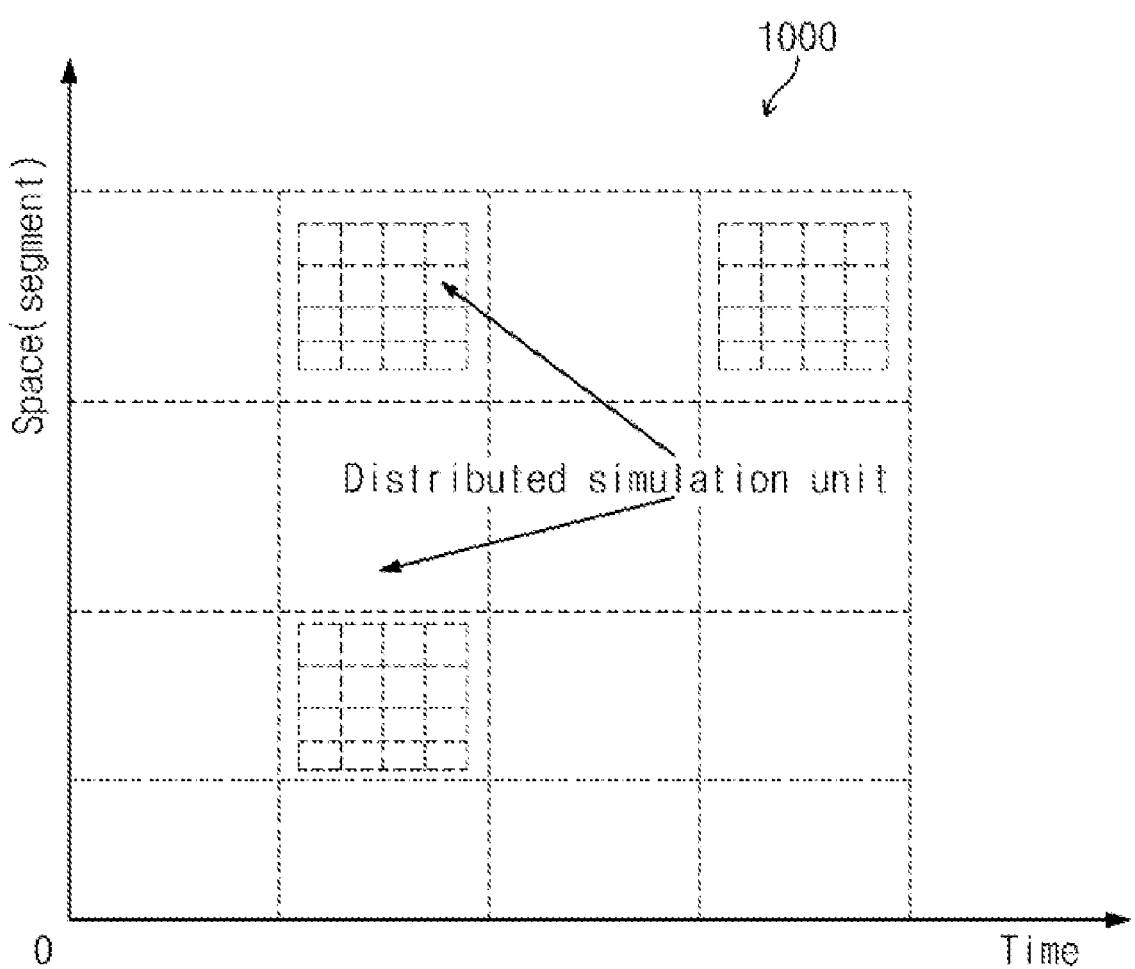

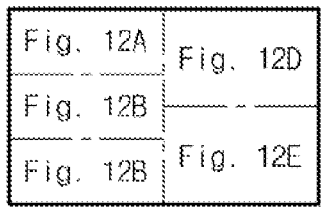
Fig. 12A
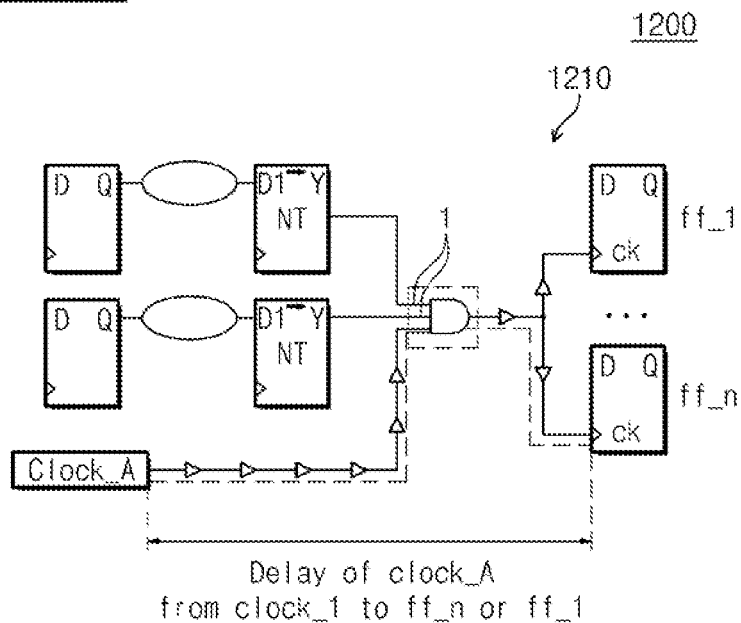
Fig. 12B
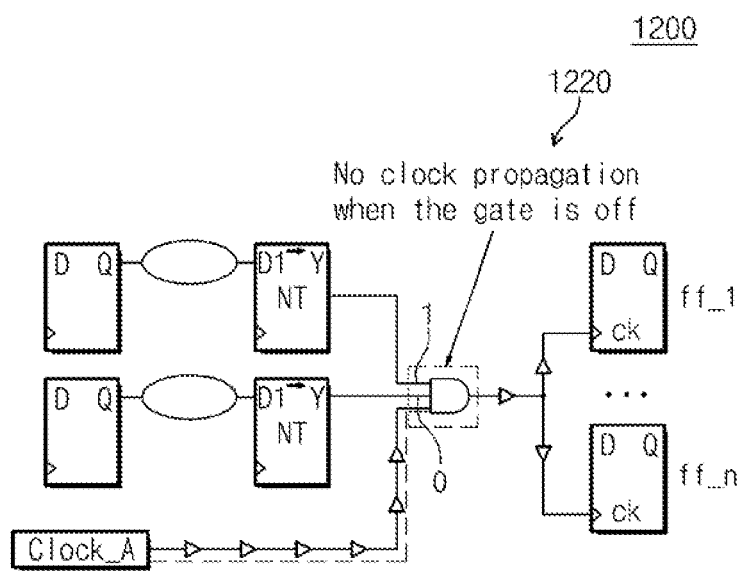

| Fig. 16A | Fig. 16B |

(a) Timing analysis during DSS simulation (b) Logical false path

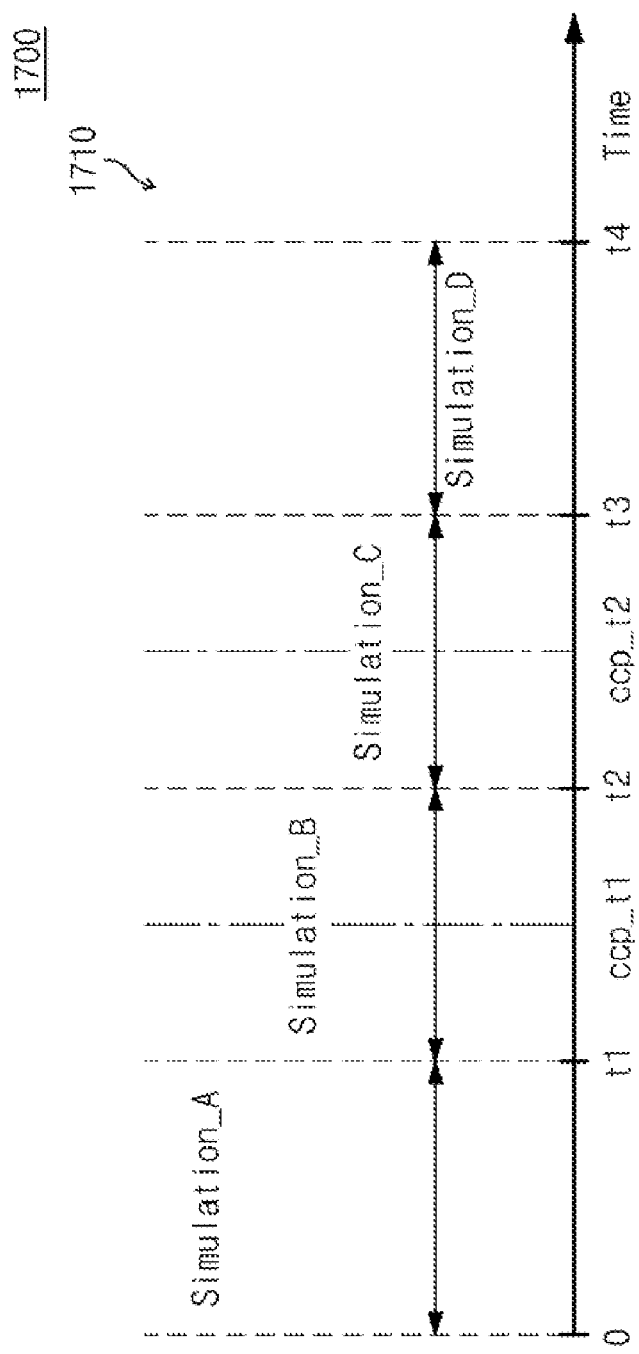

(b) DSS according to the clock changes
at ccp_t1 and ccp_t2 during simulation

| Fig.18A | Fig.18B | Fig.18C |

(a) Conventional design flow (b) DS-CBS design flow

US 7,949,510 B2

DISTRIBUTED SIMULTANEOUS SIMULATION

CROSS-REFERENCE TO RELATED APPLICATION

This application claims foreign priority under 35 U.S.C. §119 to Korean Patent Application No. 2006-43082, filed on May 12, 2006, in the Korean Intellectual Property Office, the disclosure of which is incorporated by reference herein in its entirety.

BACKGROUND OF THE INVENTION

The present disclosure relates to digital circuit simulation, and more particularly relates to distributed simultaneous simulations.

Generally, post-layout simulation has no relation to pre-layout simulation. The post-layout simulation needs to be executed for each circuit layout, and requires significant simulation time.

The simulation time of a conventional simulation system increases exponentially with an increasing circuit size. If there is an error during a functional verification, an additional simulation needs to be made from the beginning up to the error time, after detecting the error position by searching backwards from the primary port in the top level.

SUMMARY OF THE INVENTION

These and other drawbacks and disadvantages of the prior art are addressed by a system and method for distributed simultaneous simulation of digital circuits that distributes a digital circuit into independent simulation time units and independent circuit segments with reduced simulation time.

An exemplary method for distributed simultaneous simulation includes providing a state of at least one storage unit, providing a segment of the circuit bounded by the at least one storage unit, and simulating the segment in accordance with the state of the at least one storage unit.

An exemplary system for distributed simultaneous simulation includes a memory for describing storage units of a circuit, maintaining states of the storage units, and identifying distributed segments comprising combinational logic separated by the storage units, and processing units, each for simultaneously simulating at least one of the segments in accordance with the maintained states.

BRIEF DESCRIPTION OF THE DRAWINGS

The present disclosure presents a method and system for distributed simultaneous simulation of digital circuits in accordance with the following exemplary figures, in which:

FIG. 1 shows a timing table for conventional cycle-based simulation;

FIG. 2 shows a timing table for conventional event-driven simulation;

FIG. 6 shows schematic diagrams for a Net Tracer in accordance with an exemplary embodiment of the present disclosure;

FIGS. 7A-7B show schematic diagrams for modeling of a user defined storage element or top-level model in accordance with an exemplary embodiment of the present disclosure;

FIGS. 8A-8D show schematic diagrams for local time-wise independence in accordance with an exemplary embodiment of the present disclosure;

FIG. 10 shows a schematic diagram for a distributed simulation in time and space in accordance with an exemplary embodiment of the present disclosure;

FIGS. 12A-12E show schematic diagrams for clock network delays in the clock networks of FIG. 11;

FIGS. 17A-17B show schematic diagrams for a distributed simulation with changes of clock source in accordance with an exemplary embodiment of the present disclosure.

DETAILED DESCRIPTION OF PREFERRED EMBODIMENTS

Figure 3:
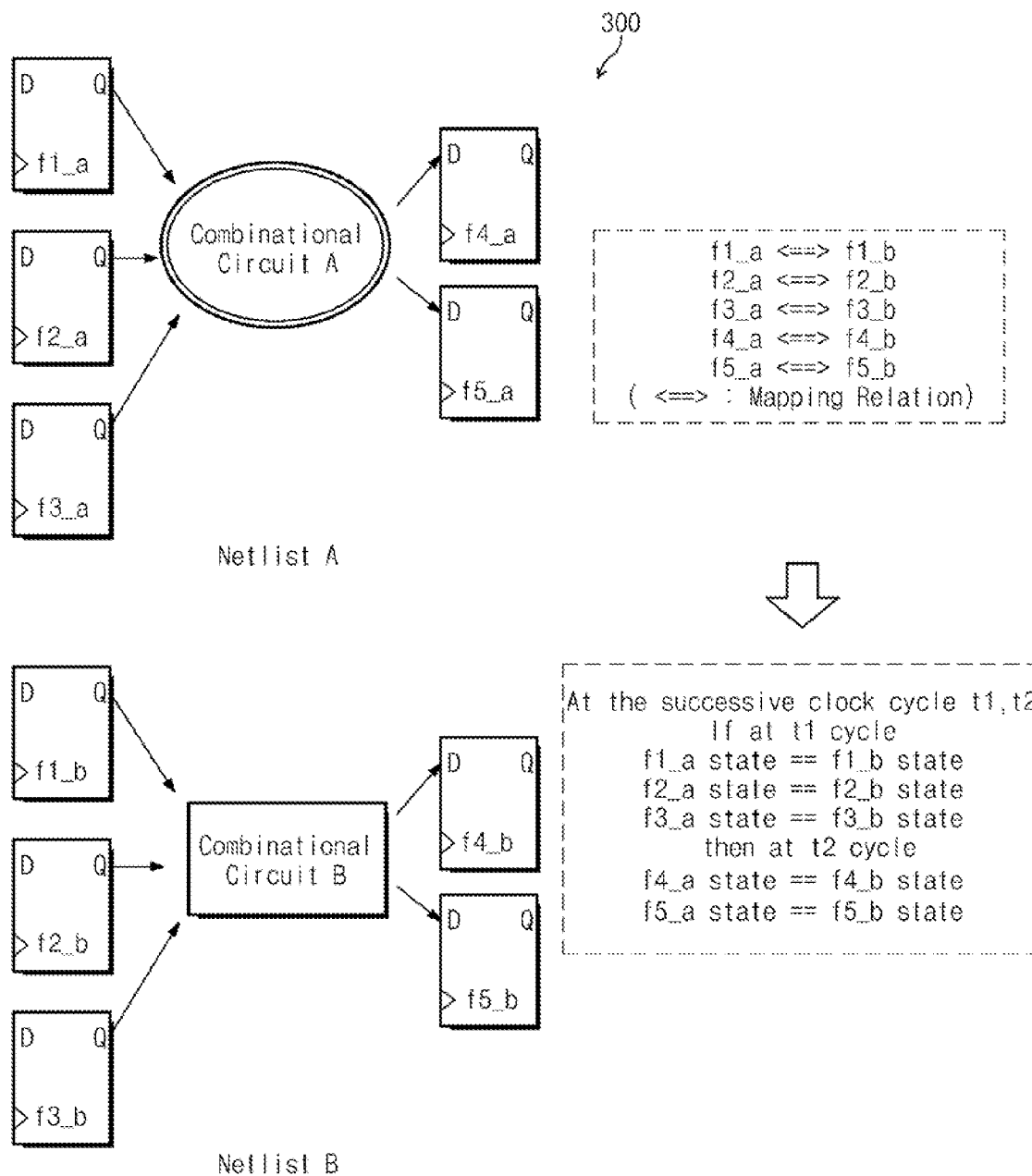
FIG. 3 shows schematic diagrams for an equivalent circuit in accordance with an exemplary embodiment of the present disclosure.
Figure 4A:
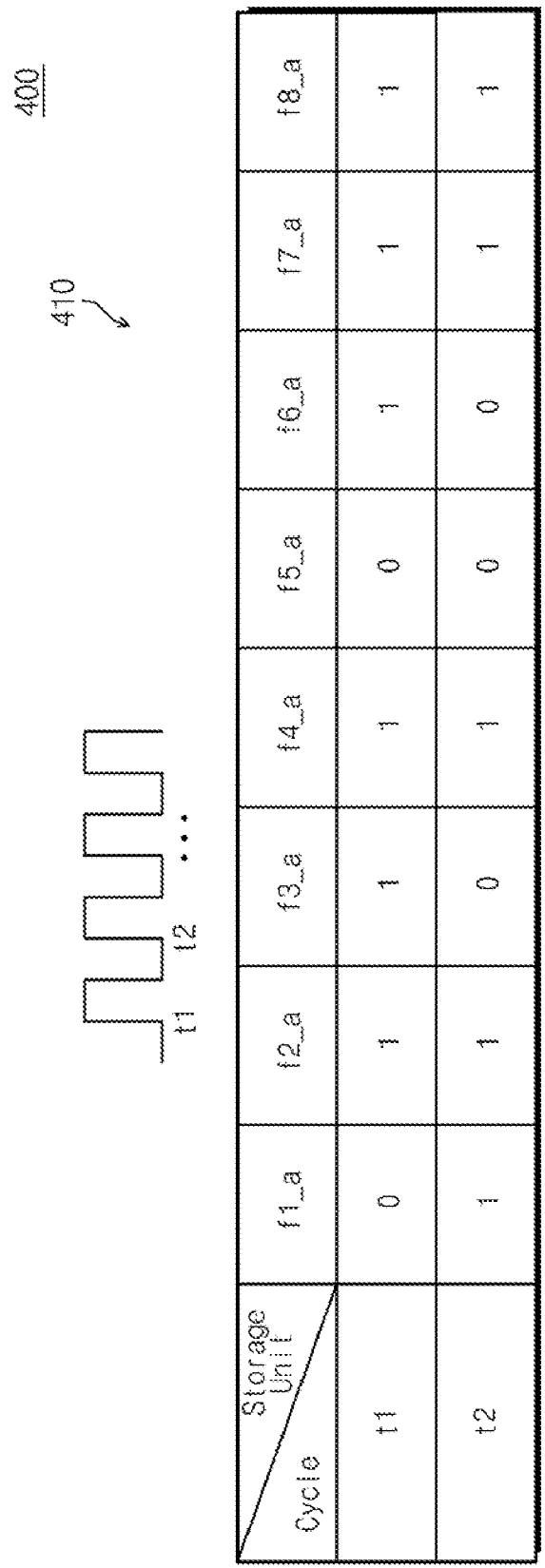
FIGS. 4A-4D show schematic diagrams for an exemplary distributed simulation in accordance with an exemplary embodiment of the present disclosure.
Figure 4B:
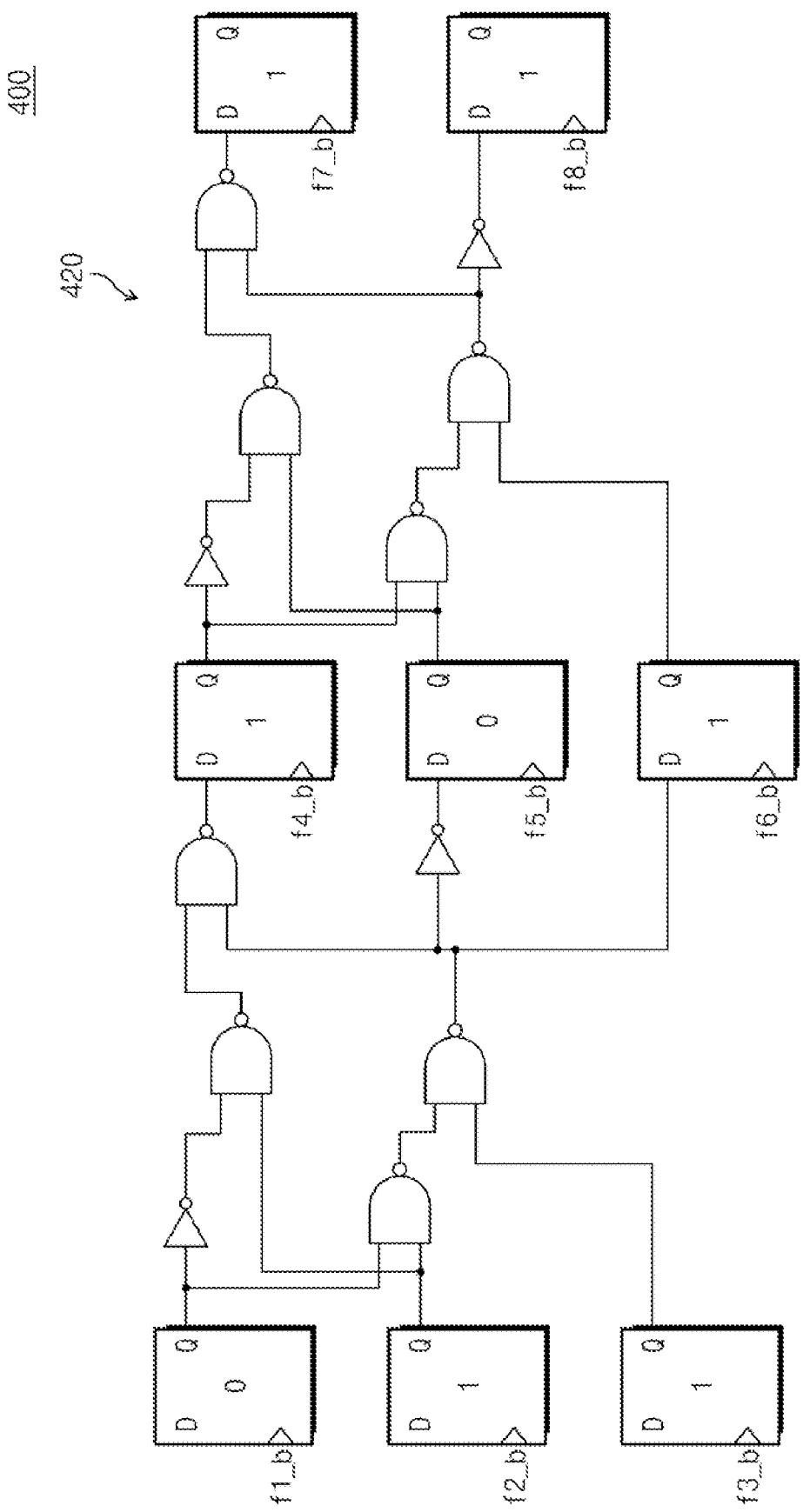
Figure 4C:
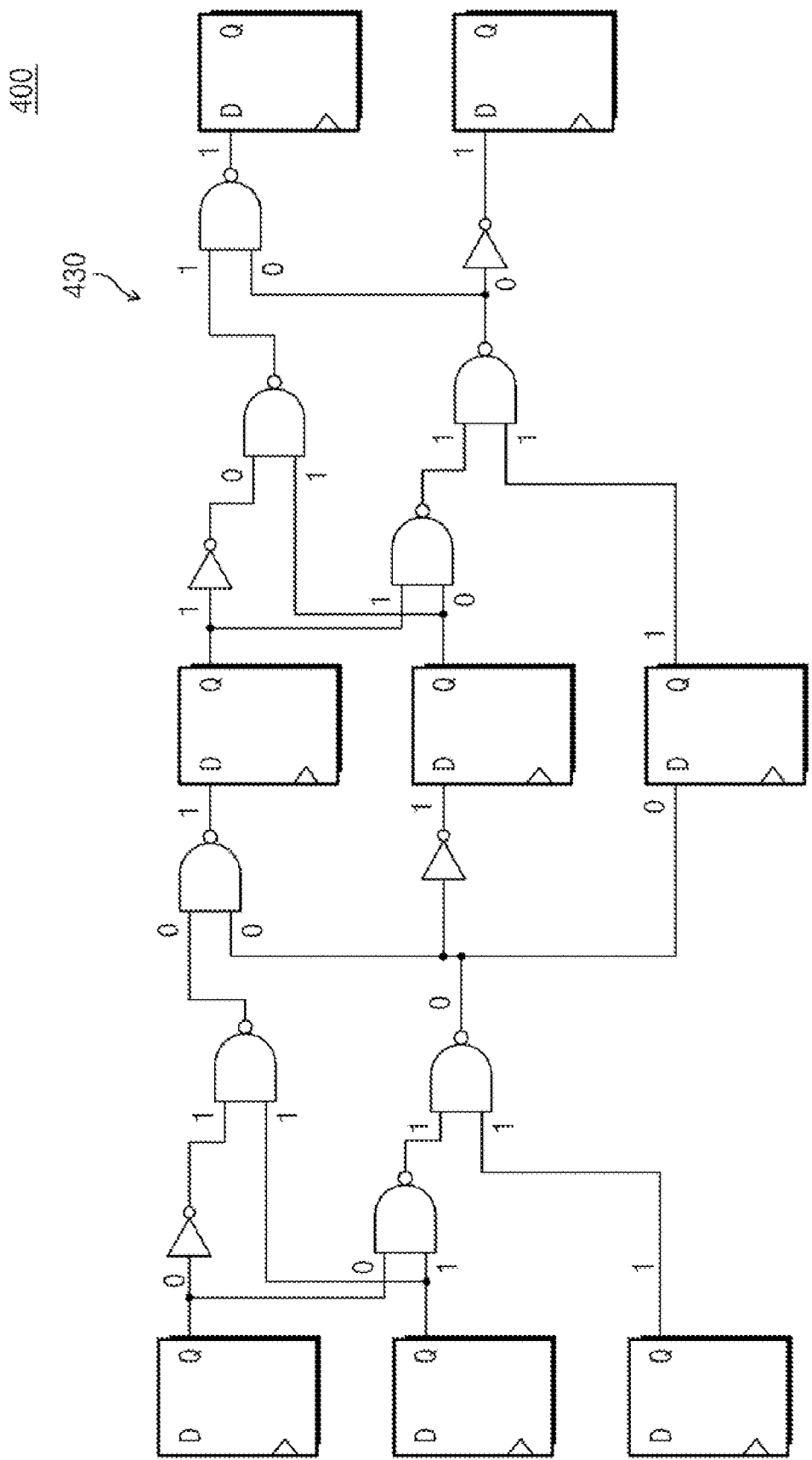
Figure 4D:
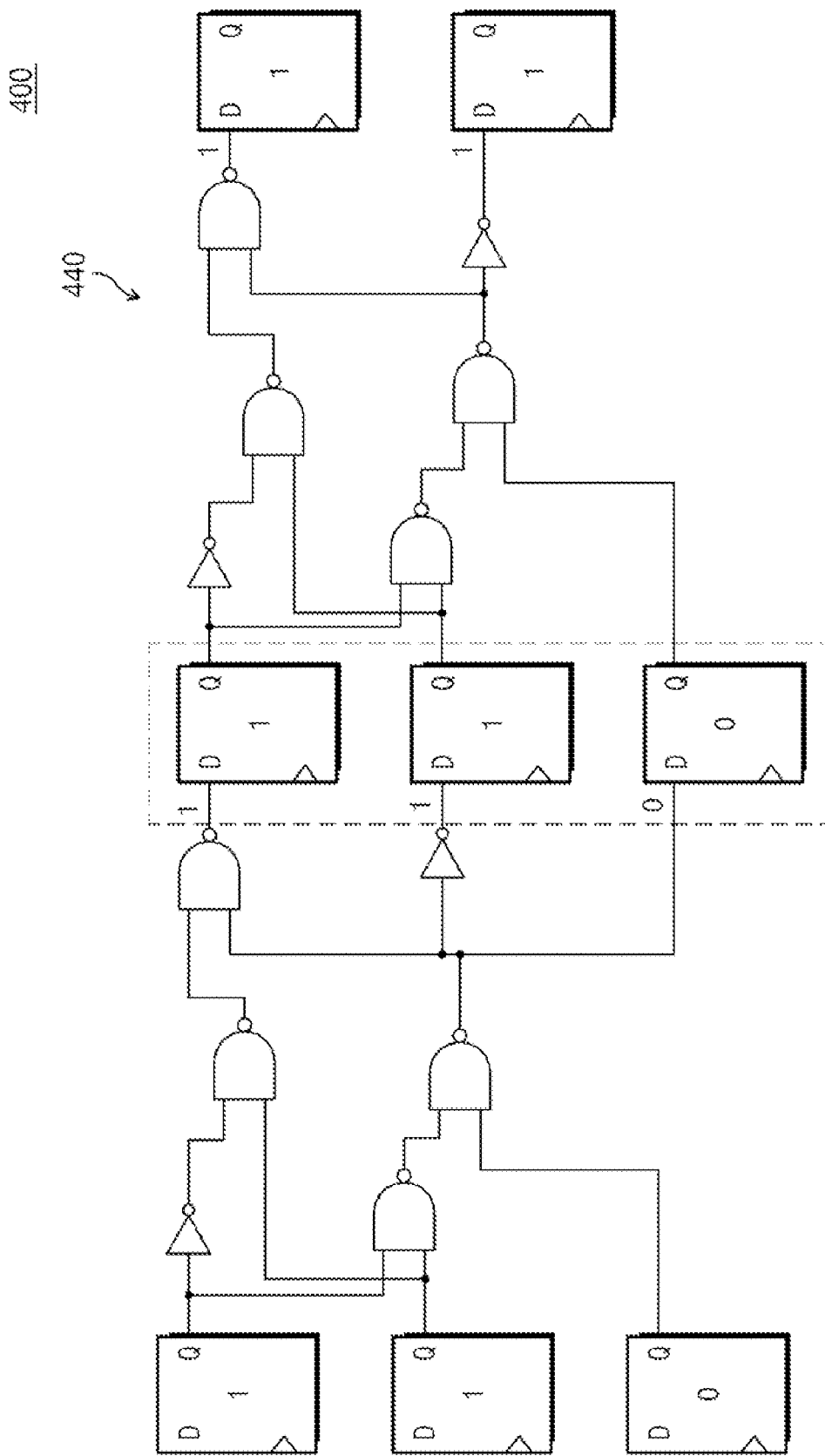
Figure 5:
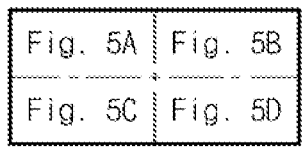
FIGS. 5A-5D show schematic diagrams for storage units in accordance with an exemplary embodiment of the present disclosure.
Figure 5A:
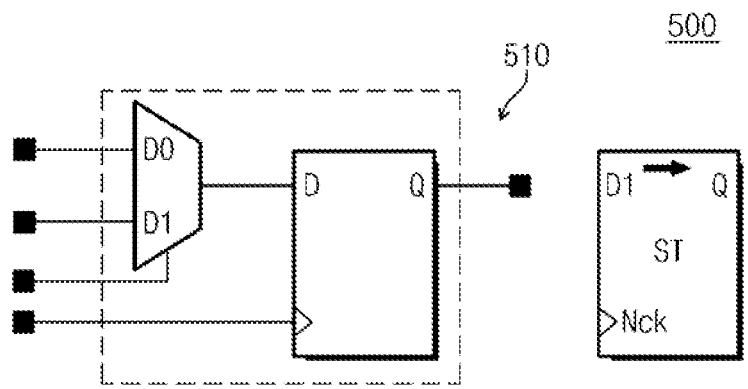
Figure 5B:
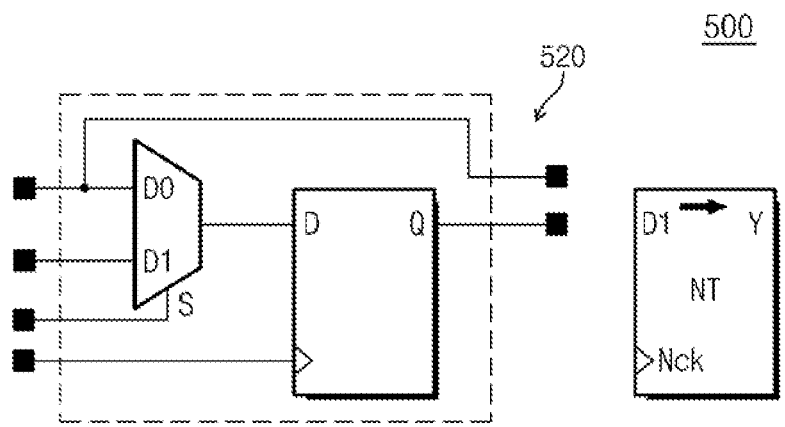
Figure 5C:
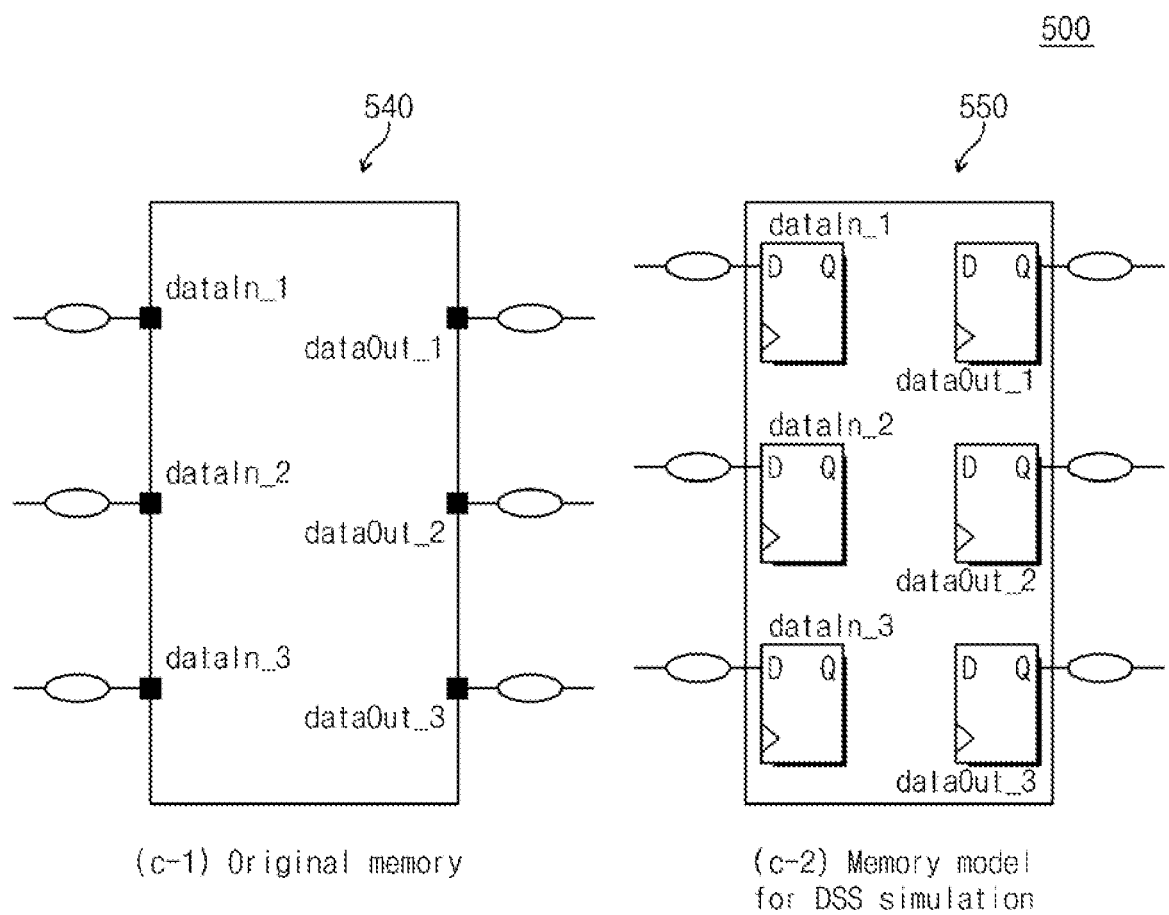
Figure 5D:
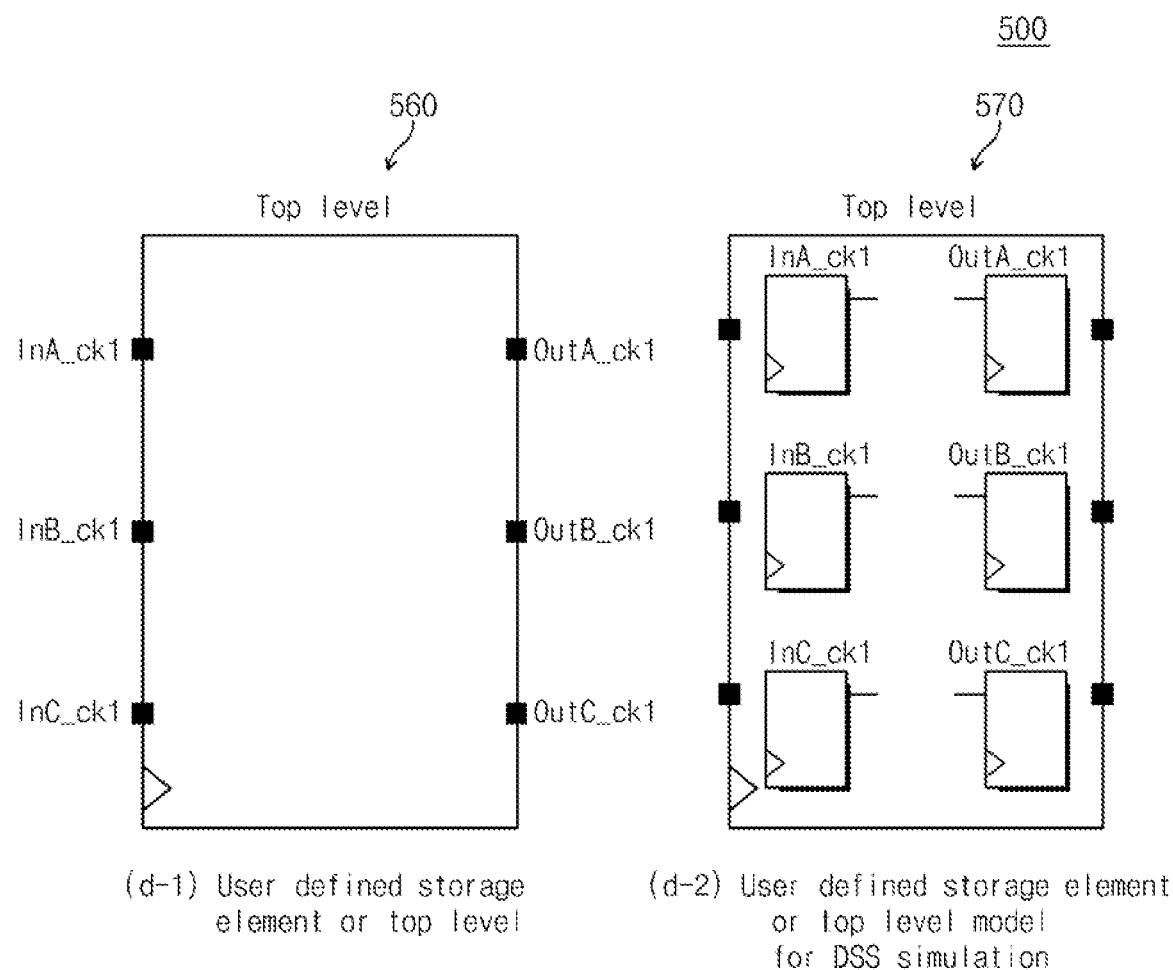

The present disclosure relates to digital circuit simulation, and more particularly relates to distributed simultaneous simulation methods and systems with distributed computing based on independent time regions and independent segments. Embodiments of the present disclosure may be cycle-based and/or event-driven. A distributed simultaneous simulation system for digital circuits that distributes the digital circuit into independent simulation time units and independent circuit segments may significantly reduce simulation time.

In a conventional cycle-based simulation example, one way to simulate the floating-point unit (FPU) of a Pentium CPU would be to examine every clock cycle to see what is happening in the FPU. This is called an exhaustive simulation. The information of interest would be the cycles or events that cause a change in the state of the system.

As shown in FIG. 1, a simplified list of sample event possibilities for a conventional cycle-based simulation example is indicated generally by the reference numeral 100. The simplified list 100 includes events for Division Operation Begins at clock cycle 1, Division Operation Completes at clock cycle 4, Multiplication Operation Begins at clock cycle 6, Multiplication Operation Completes at clock cycle 8, with no events at the simulated intervening clock cycles, and may further include an Interrupt Event. This is a conventional cycle-based exhaustive simulation because every clock cycle is considered, regardless of whether there is an event or activity such as a change in the state of the system at every clock cycle. Such a simulation takes significant simulation time without a distributed computing technique, and does not provide a user with any reusable simulation results based on a simulation cycle. That is, the user has to do the same simulation many times from a simulation time of zero to a particular simulation time in order to verify a function of a circuit at the particular time.

Similarly, in a conventional event-driven simulation example, the two traces contain the same amount of information. The event-driven simulation skips times when there is no change in the state of the system and only examines the actual changes or events.

Turning to FIG. 2, a simplified list of sample event possibilities for a conventional event-driven simulation example is indicated generally by the reference numeral 200. The list 200 includes events such as Division Operation Begins at clock cycle 1, Division Operation Completes at clock cycle 4, Multiplication Operation Begins at clock cycle 6, Multiplication Operation Completes at clock cycle 8, and may further include an Interrupt Event. A conventional event-driven simulation saves a tremendous amount of processing time to complete compared to a conventional cycle-based exhaustive simulation.

Unfortunately, a conventional event-driven simulation does not provide a user with any reusable simulation results for a simulation cycle. The user still has to do the same simulation many times from a simulation time of zero to a particular simulation time to verify a function of a circuit at the particular time.

Exemplary embodiments of the present disclosure will be described with reference to FIGS. 3 through 18. If all of the storage states are saved at every clock cycles the data can be reused in many respects. A digital circuit may be divided into independent segments closed or bounded by storage units, and the independent segments can be simultaneously simulated such that many independent circuits can be simulated at the same time. This is due to spatial independence. A simulation may be started at any time based on the stored data of the digital circuit during the previous simulation. This is due to time-wise independence.

The storage state may be saved at every clock cycle during pre-layout such as for resistor-transistor logic or gate level, or during post-layout simulation, or by a hardware emulator. The storage state may then be used for every clock cycle during pre-layout with no delay such as register-transistor logic (RTL) or gate level, or during post-layout simulation to save simulation time.

Exemplary embodiment Distributed Simultaneous Simulation (DSS) systems are provided herein with reference to the following terms. Pre-layout simulation is a zero-delay simulation before a delay annotation is applied to all nets and circuit elements, such as flip-flops (F/F), gates, transistors (TR), and the like. Pre-layout simulation includes RTL and gate simulation without a delay annotation. Post-layout simulation is a delay simulation after delays are annotated into all circuit elements (e.g., F/F, gates, TR, and the like) and nets. A clock domain is a region having storage units connected to the same clock. A Storage Tracer is a real storage element such as a F/F or latch. A Net Tracer is a pseudo storage element inserted into inputs and outputs of a memory or a Macro cell, or clock control nets.

A Storage Tracer in a clock control net makes an effective clock state, and a node between combinational logics to monitor the node or to divide segments at the node at every clock cycle. Clock Tracer is a pseudo storage element to store a state of a clock net at every clock cycle. Storage units include all real storage elements synchronous with a clock such as F/F, latch, and the like. Memory cell or Macro cell have a pseudo storage element such as a F/F in the input and/or output port to store the input and/or output state at every clock cycle. Net/Clock Tracer is a pseudo storage element such as a F/F monitoring or storing a particular net and clock node at every clock cycle. An equivalent circuit and Storage Unit is used where every digital circuit consists of a sequential circuit and a combinational circuit, and every digital circuit has an equivalent circuit that models the original circuit with storage units and combinational units between the storage units.

Embodiments of the present disclosure save all of the states of the target digital circuit at every clock cycle by using the concept of a "storage unit". Exemplary embodiments of the present disclosure can be applicable to all kinds of digital circuits, save all the states at every clock cycle, and restore all the states at any simulation time by using stored data of the storage units in the target digital circuit. Thus, the states of storage units can be generated quickly by a zero-delay simulation or a hardware emulation using a hardware emulator or a field-programmable gate array (FPGA).

If all the states of storage units in the target digital circuit are known, one can restore the state of the digital circuit at any cycle without an additional simulation from the beginning. The stored states of storage units in the target digital circuit can be applied to equivalent netlists synthesized in different environments or design libraries as well as to the original digital circuit because the storage units between the two different netlists are maintained to be mapped equally even if the combinational logics can be different after synthesis. In addition to the fast simulation, DSS embodiments of the present disclosure can check a functional verification according the expected state of storage units and the calculated state of storage units between two equivalent netlists during a digital circuit design.

Turning now to FIG. 3, an equivalent circuit in accordance with an exemplary embodiment of the present disclosure is indicated generally by the reference numeral 300. In the equivalent circuit 300, the netlist B is equivalent to the netlist A. Thus, if the f1, f2 and f3 states are mapped for netlist A and netlist B at clock cycle t1, then the f4 and f5 states are mapped for netlist A and netlist B at clock cycle t2.

As shown in FIGS. 4A-4D, a DSS simulation for a segment in accordance with an exemplary embodiment of the present disclosure is indicated generally by the reference numeral 400. A storage unit table 410 shows the result of an extract and save of all of the states of storage units from the netlist A at cycles t1 and t2 during a simulation. A circuit 420 shows the flip-flop values to restore all the states of the storage units to the netlist B at cycle t1. A diagram 430 shows the flip-flop values to calculate the next states of the storage units in the netlist B; and a diagram 440 compares the expected states of storage units with the calculated states of the storage units in the netlist B. Thus, FIG. 4 illustrates the time-wise independence, storage unit management, and simultaneous functional verification of the present disclosure.

Turning to FIGS. 5A-5D, storage units in accordance with an exemplary embodiment of the present disclosure are indicated generally by the reference numeral 500. A storage tracer 510 is shown as a scanable D F/F and latch. A net tracer 520 is shown as a scanable D F/F and latch with a bypass path and an additional monitoring port from the D F/F or latch. The storage units are also shown for an original memory 540, a memory model 550 for DSS simulation that corresponds to the original memory 540, a user-defined storage element or top level model 560, and a user-defined storage element or top level model 570 for DSS simulation that corresponds to the model 560. Thus, the storage Units may include a F/F or a latch, a Net Tracer, a memory model, and a user defined storage element model, for example. The F/F may be a delay or D F/F, which can be edge triggered to flip on a clock input, such as Nck. One can model all kinds of storage elements with Storage Tracer and Net Tracer. A Net Tracer is used to divide a circuit into several independent segments and make a storage element model for DSS simulation. One can treat an original memory and a macro model with storage elements inside as an independent segment.

Turning now to FIG. 6, a Net Tracer in accordance with an exemplary embodiment of the present disclosure is indicated generally by the reference numeral 600. An original circuit 610 is shown. A storage tracer is indicated by 620 and a net tracer is indicated by 630. A DSS model 640 is based on the original circuit 610: but includes an added net tracer 630 and two added storage tracers 620. The Net Tracer 630 includes a F/F, a MUX for a normal mode and a trace mode, two input ports for a normal input and a trace input a control signal port selecting an operation mode, two output ports for a normal output and a monitoring output in normal operation, and a clock input port.

The Net Tracer is a pseudo storage cell inserted during a DSS simulation, and is not in the real netlist. A normal operation path is used in normal mode, capturing path is used in normal mode, and shifting path is used in saving and restoring operation modes.

Figures 7, 7A:
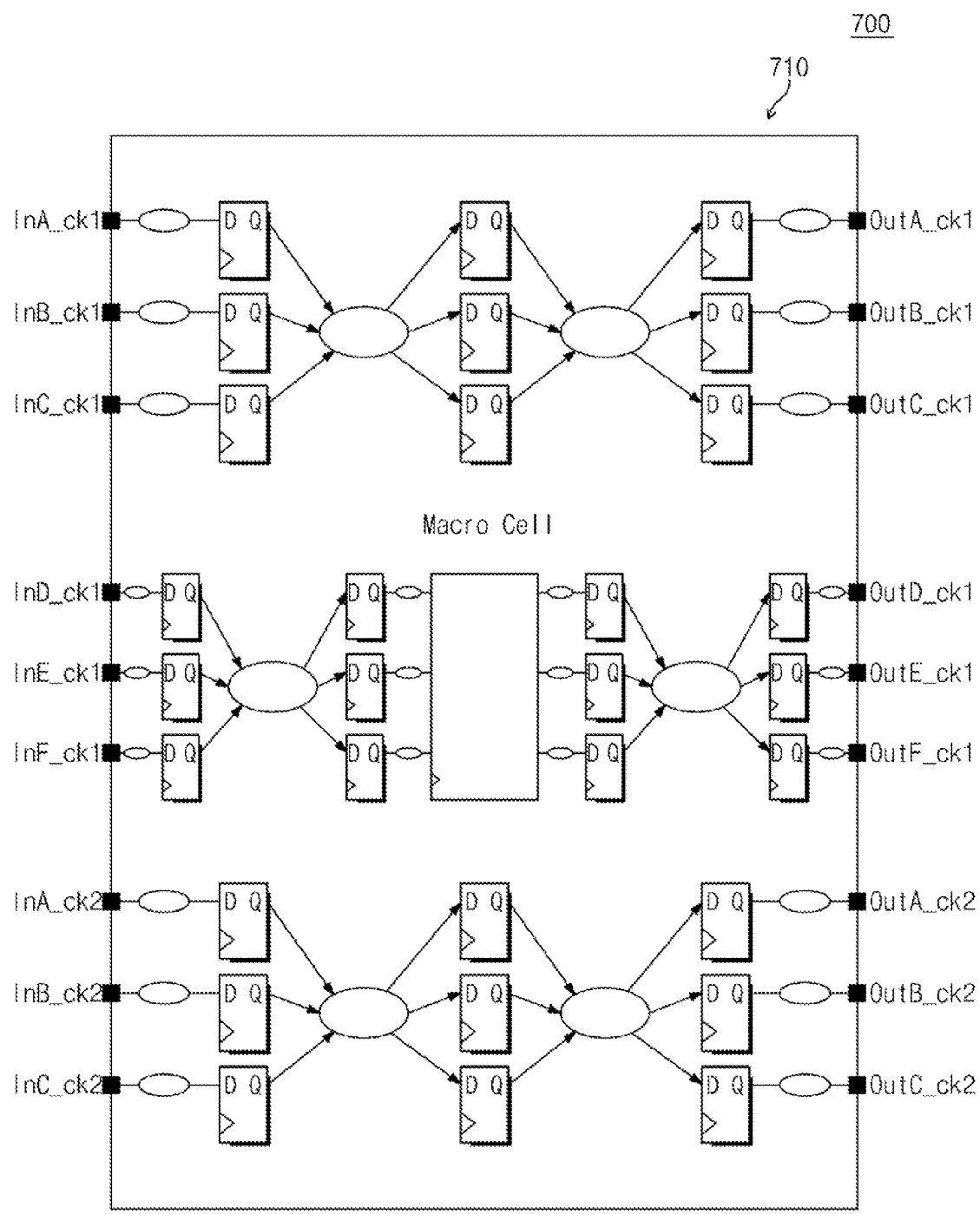
Figure 8A:
Figure 8B:
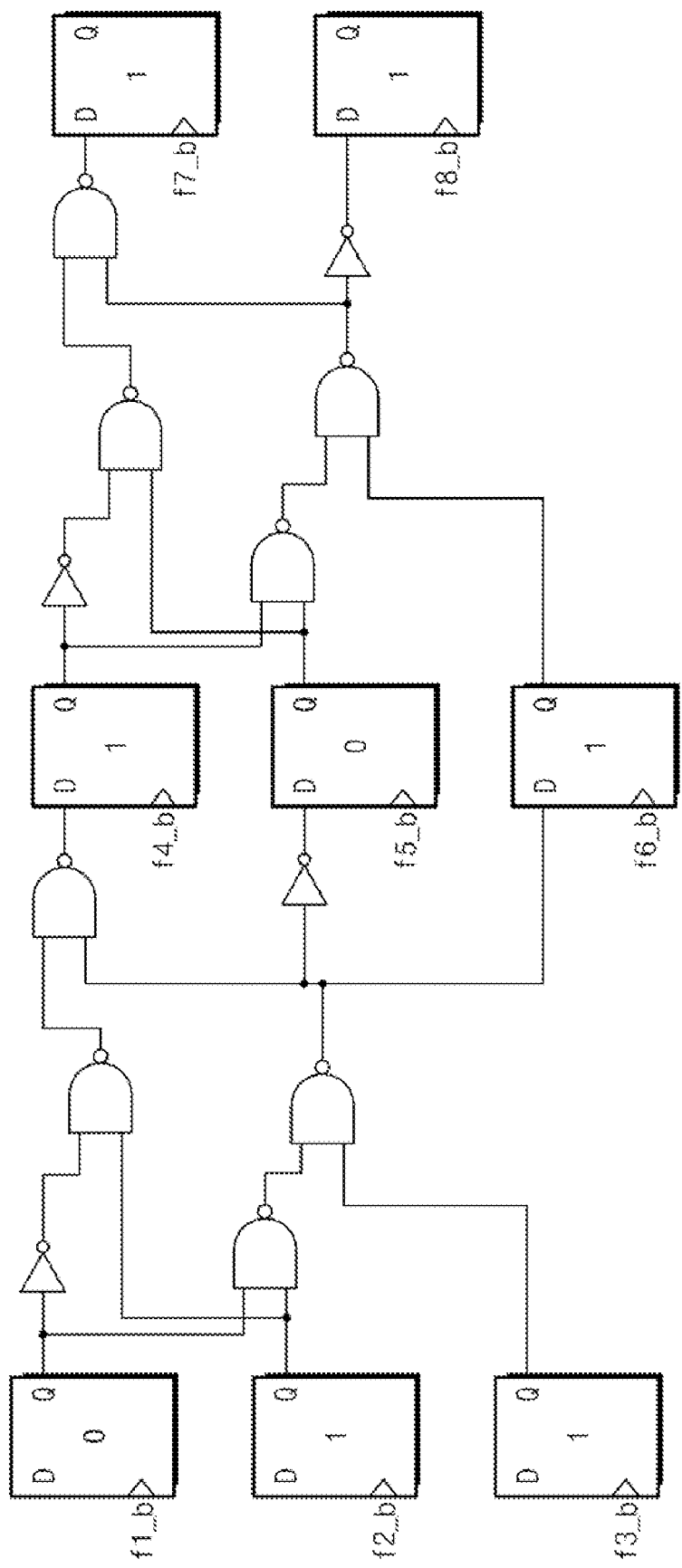

As shown in FIGS. 7A-7B, modeling of a user defined storage element or top-level model in accordance with an exemplary embodiment of the present disclosure is indicated generally by the reference numeral 700. An original user-defined circuit is indicated by 710 and a user-defined storage element model for DSS simulation is indicated by 720. Here, the model for DSS simulation has storage tracer elements added at each input and output of the main circuit, as well as at each input and output of a macro cell within the circuit.

Turning to FIGS. 8A-8D, local time-wise independence in accordance with an exemplary embodiment of the present disclosure is indicated generally by the reference numeral 800. A storage unit table 810 shows the result of an extract and save of all of the states of storage units from the net list A at cycles t1 and t2 during a simulation. A circuit 820 shows the flip-flop values to restore all the states of the storage units to the netlist B at cycle t1. A diagram 830 shows the flip-flop values to calculate the next states of the storage units in the netlist B; and a diagram 840 compares the expected states of storage units with the calculated states of the storage units in the netlist B. Thus, FIG. 8 illustrates the time-wise independence, storage unit management, and simultaneous functional verification of the present disclosure. DSS makes it possible to start a simulation at any time.

Figures 9, 9A:
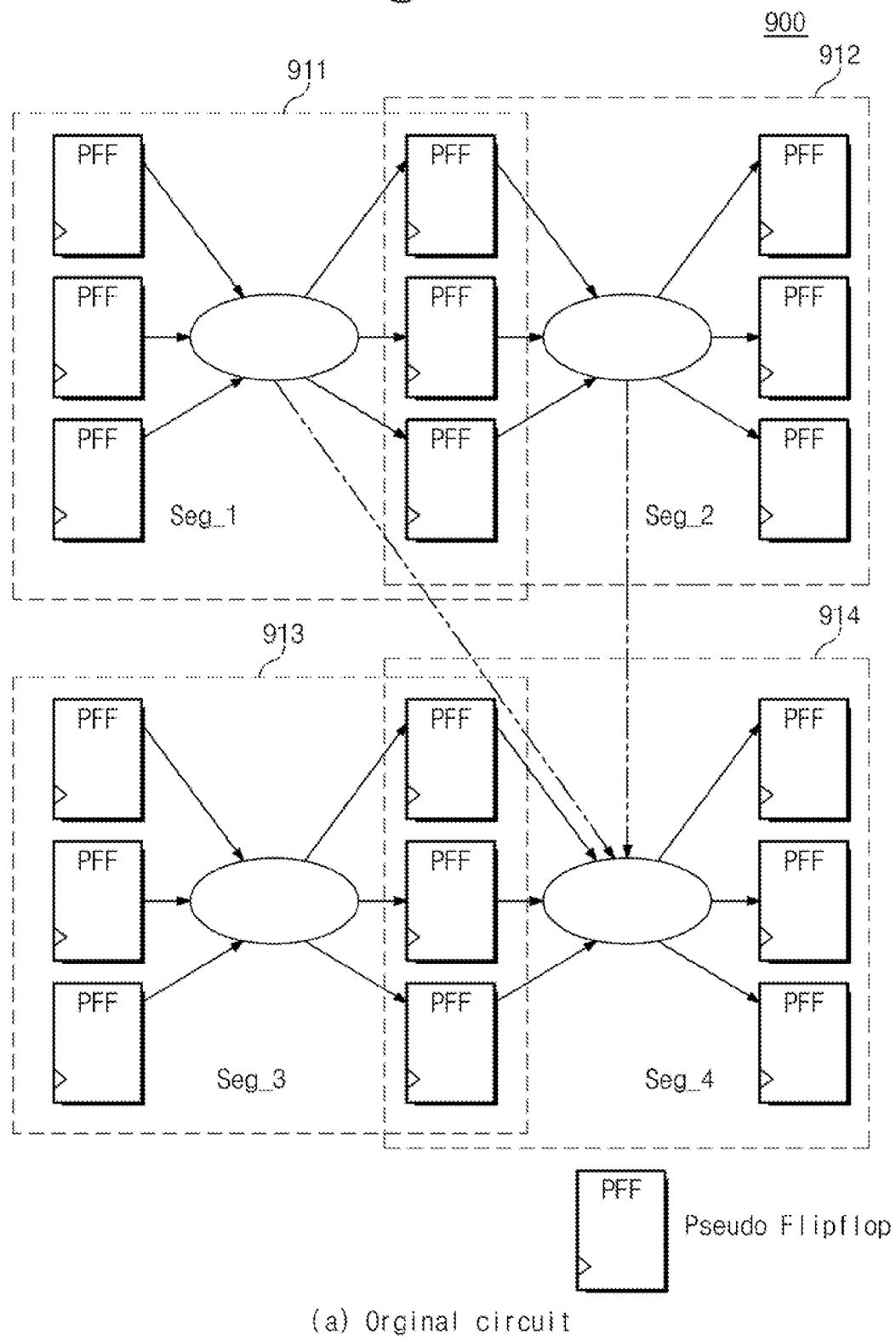
FIGS. 9A-9B show schematic diagrams for spatial independence in accordance with an exemplary embodiment of the present disclosure.
Figure 9B:
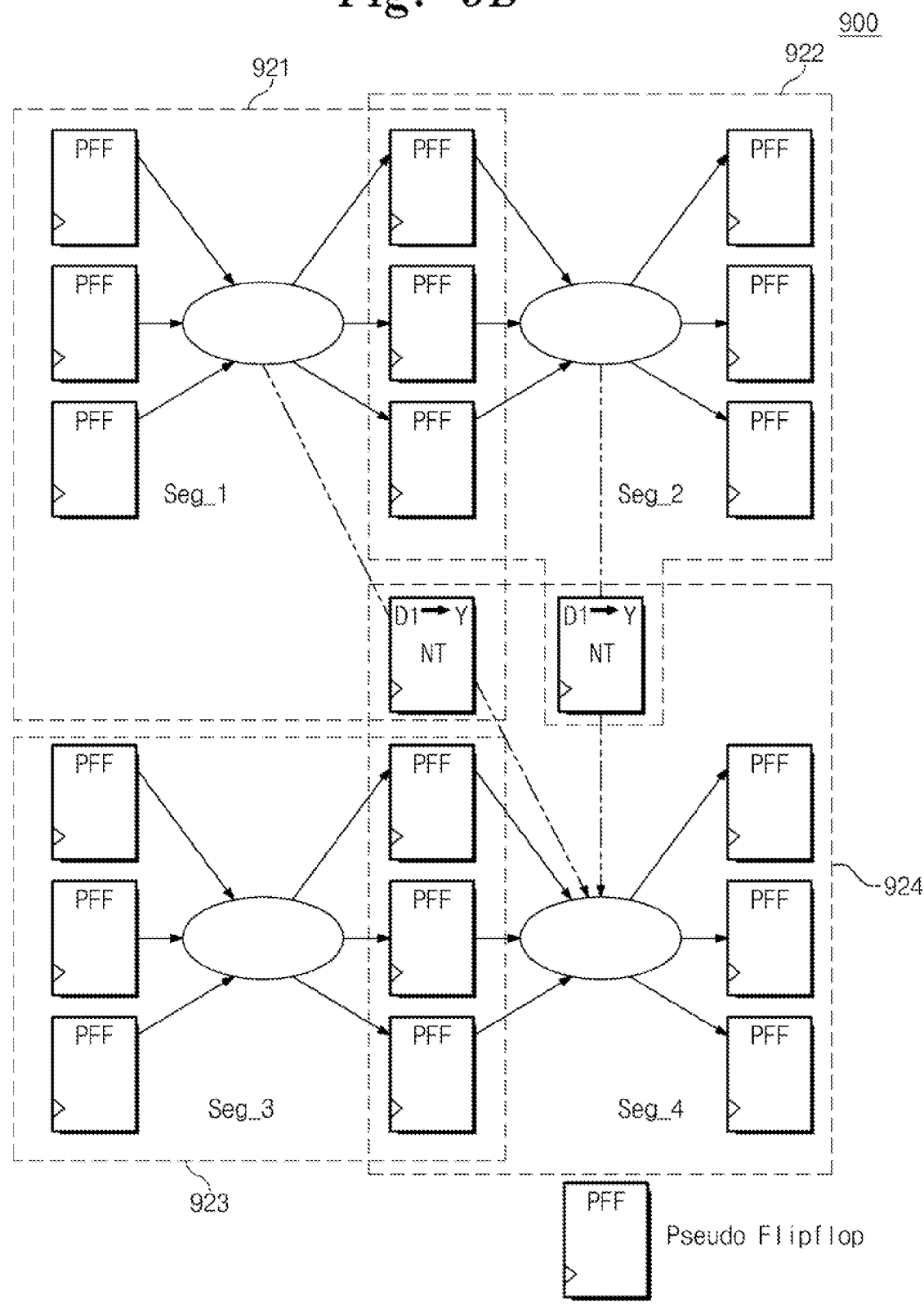

Turning now to FIGS. 9A-9B, spatial independence in accordance with an exemplary embodiment of the present disclosure is indicated generally by the reference numeral 900. Here, the term soft is used to refer to an original segment with a dependency, the term hard is used to refer to any segment with no original dependency, and the term semi-hard is used to refer to a DSS segment for which a dependency has been eliminated by inserting at least one net tracer or storage tracer element. An original circuit 910 includes a first segment 911 or Seg_1, which is soft due to a dependency with Seg_4, a second segment 912 or Seg_2, which is soft due to a dependency with Seg_4, a third segment 913 or Seg_3, which is hard, and a fourth segment 914 or Seg_4, which is soft due to dependencies with Seg_1 and Seg_2.

A DSS model 920 for the original circuit includes added net tracers to make semi-hard segments from the soft segments of the original circuit. Thus, Seg_1 becomes semi-hard 921 by inserting a net tracer in the dependent path between Seg_1 and Seg_4, Seg_2 becomes semi-hard 922 by inserting a net tracer in the dependent path between Seg_2 and Seg_4. Seg_3 remains hard 923, and Seg_4 becomes semi-hard 924 due to the inserted net tracers from Seg_1 and Seg_2. Thus, a Net tracer is used to divide a circuit into several independent segments and make a storage element model for DSS simulation. As a result, one can simulate each segment and verify functionality simultaneously by using stored states of the storage units.

Seg_3 is a hard segment, which has connections through F/Fs with other segments in the original circuit. That is, the segment is closed by F/Fs. Seg_1. Seg_2, and Seg_4 are originally soft segments, which have connections without intervening F/Fs through the connections in the original circuit. That is, they are not closed by F/Fs. One can make all of the segments independent segments, whether hard or semi-hard segments, by inserting Net Tracers into the direct paths.

As shown in FIG. 10, a distributed simulation in time and space in accordance with an exemplary embodiment of the present disclosure is indicated generally by the reference numeral 1000. DSS can make dividing a target digital circuit into many segments or sub-blocks work independently with the states of storage units inside segments or sub-blocks. DSS can make hard segments or semi-hard segments start at any particular time because DSS already stored the state of the storage units at the particular time during the previous simulation.

Figure 11:
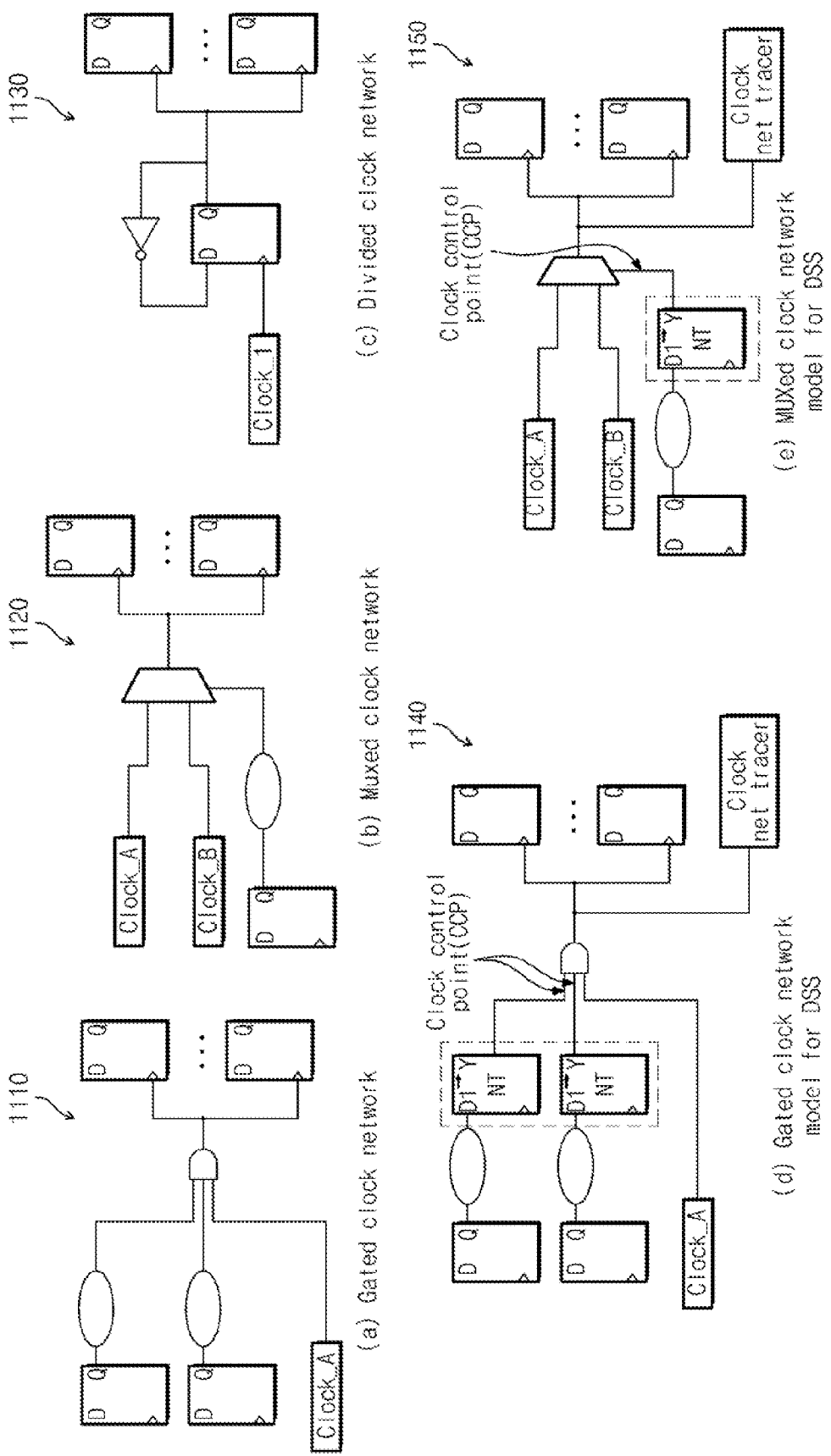
FIG. 11 shows schematic diagrams for clock networks in distributed simulation systems in accordance with an exemplary embodiment of the present disclosure.
Figure 12C:
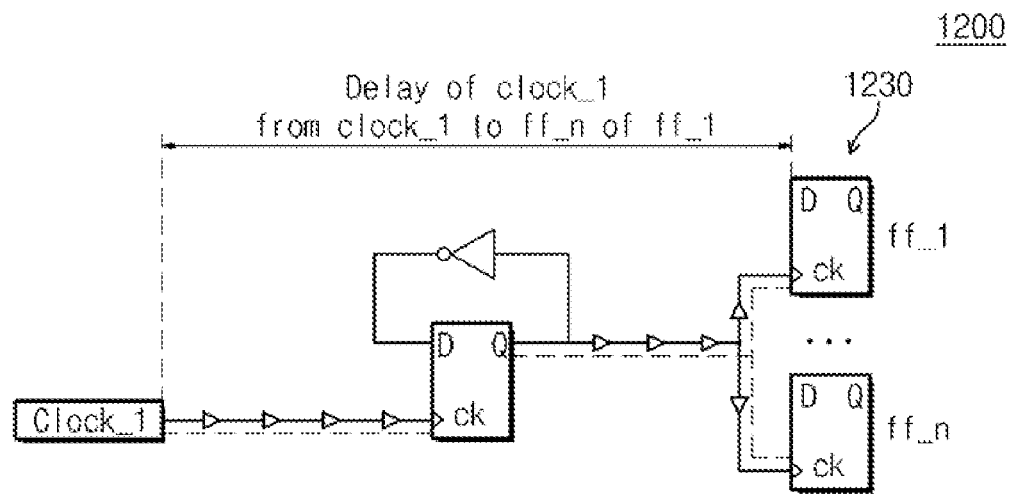
Figure 12D:
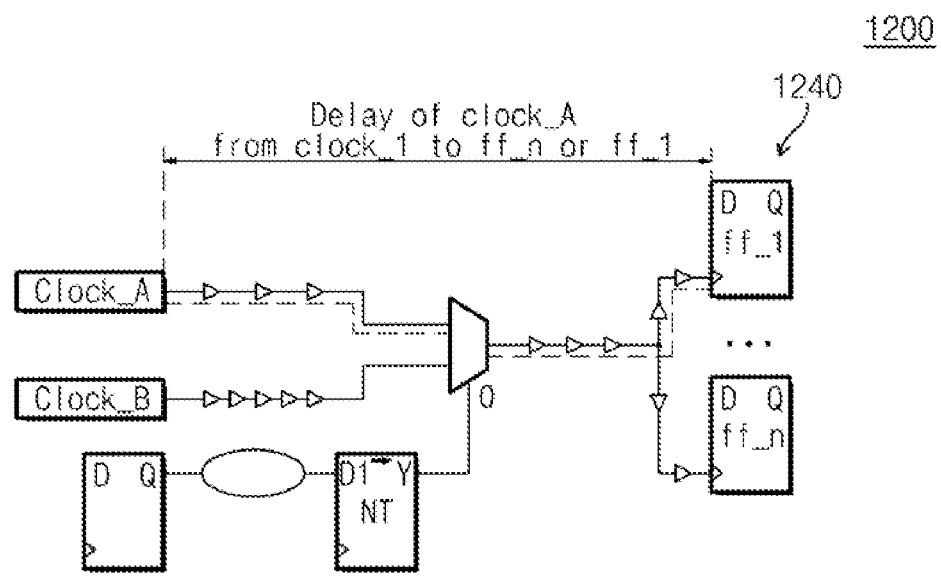
Figure 12E:
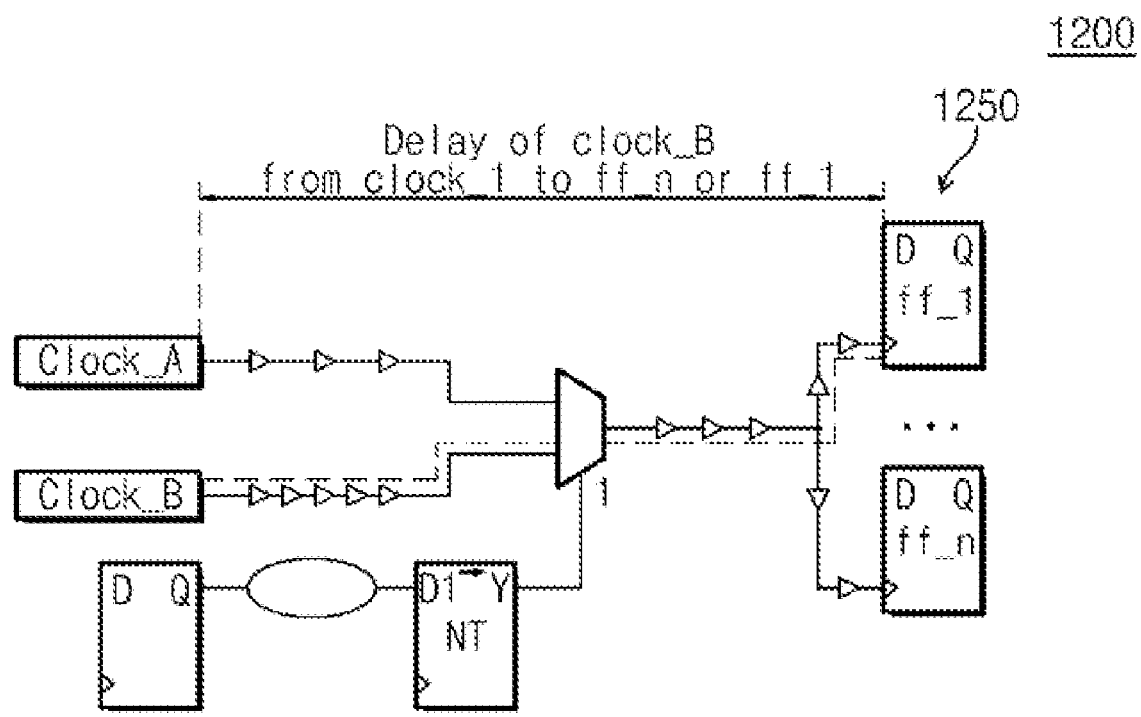

Turning to FIG. 11, clock networks in DSS in accordance with an exemplary embodiment of the present disclosure are indicated generally by the reference numeral 1100. Here, the clock networks include a gated clock network 1110, a multiplexed clock network 1120, a divided clock network 1130 having a T F/F, a gated clock network model for DSS 1140, and a multiplexed clock network model for DSS 1150. A clock domain is a region having storage units connected to the same clock. A clock node can be defined to expect states of the clock node in advance with inserted net tracers into a Clock Control Point (CCP), which is a node to control a final clock state, pre-determine the state of the final clock with stored states of storage units connected to the clock node inside a region, and then make a DSS simulation. Thus, the DSS models 1140 and 1150 each include at least one net tracer to form a clock control point (CCP). There is no need to insert a net tracer in divided clock network case because the original clock source, such as "Clock_1" in a divided clock network, can become a reference clock to all of the storage units following the F/F connected to Clock_1.

Turning now to FIGS. 12A-12E, clock network delays in CS-DBS in accordance with an exemplary embodiment of the present disclosure are indicated generally by the reference numeral 1200. Here, a delay 1210 corresponds to the gated clock network 1110 of FIG. 1, a delay 1220 corresponds to the multiplexed clock network 1120 of FIG. 11, a delay 1230 corresponds to the divided clock network 1130 of FIG. 11, a delay 1240 corresponds to the gated clock network model for DSS 1140 of FIG. 11, and a delay 1250 corresponds to the multiplexed clock network model for DSS 1150 of FIG. 11. Thus, the clock propagation can be prohibited in response to the Clock Control Points (CCP) in a gated clock network. The clock delay can be variable in response to the control signal to a clock multiplexer (MUX) in a multiplexed clock network.

A clock delay may be calculated relative to a generated clock. For example, the clock delay 1230 may be calculated from an external clock, such as Clock_1, to a flip-flop defining a generated clock, and another clock delay may be calculated from that generated clock to the next flip-flop. In addition, the clock source in a clock domain can be changed in response to its CCPs during the DSS simulation.

Figure 13:
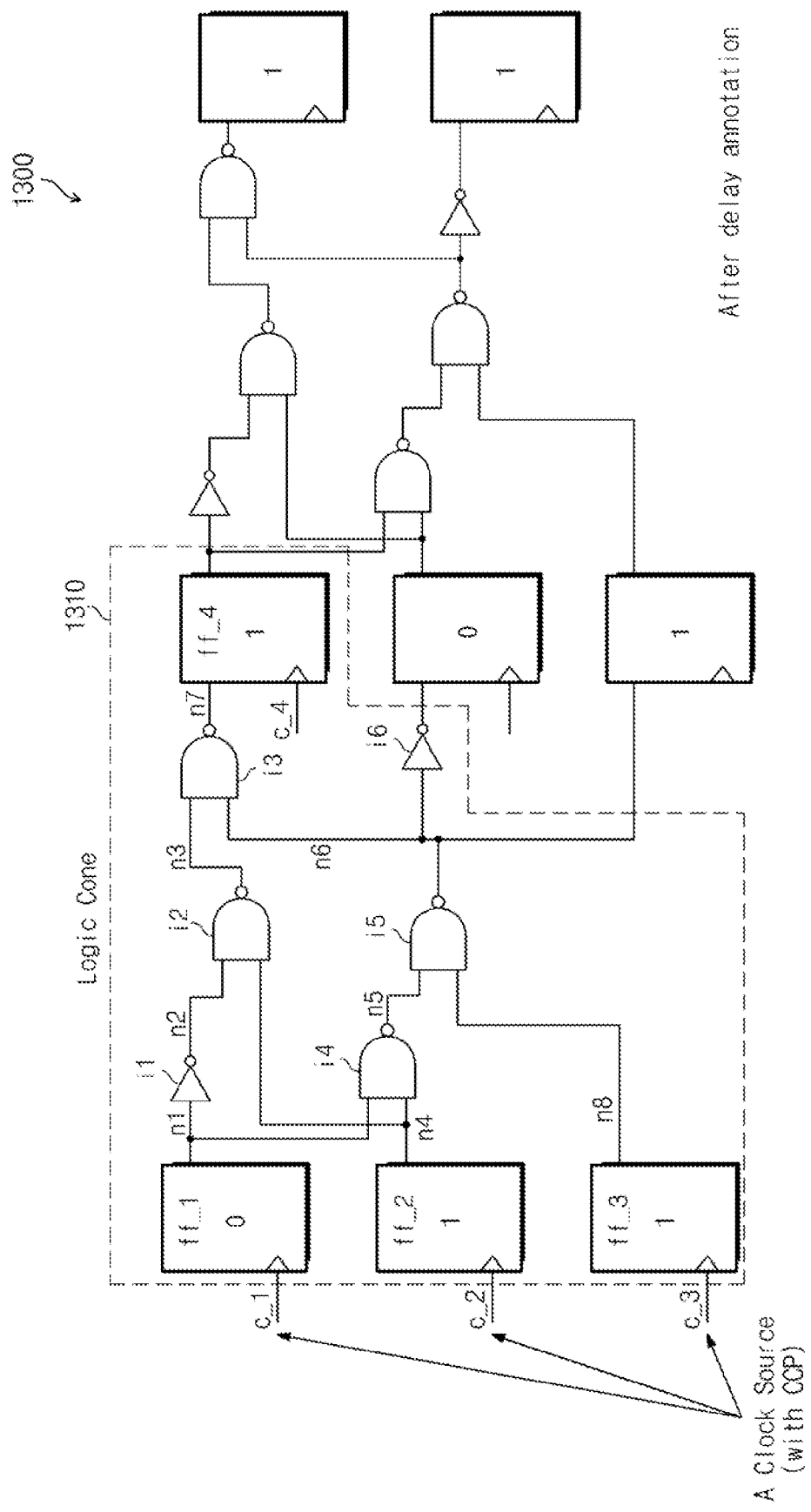
FIG. 13 shows schematic diagrams for a combinational logic delay in distributed simultaneous simulation in accordance with an exemplary embodiment of the present disclosure.

As shown in FIG. 13, a combinational logic delay in DSS in accordance with an exemplary embodiment of the present disclosure is indicated generally by the reference numeral 1300. Here, a real delay related to a clock source, a storage unit delay and a gate delay in a combinational logic circuit may each be calculated. A clock delay is from a clock source to outputs of storage units such as ff_1, ff_2, and ff_3. Gate delays are from outputs of storage units to the next storage unit, such as ff_4.

Since the current states of the storage units in a logic cone 1310 and all of the delays of storage units and combinational logics are known, one can calculate the real delay to a storage unit such as ff_4 after a start of time t1. As a result, DSS can be applicable to both pre-layout and post-layout simulation.

Figure 14:
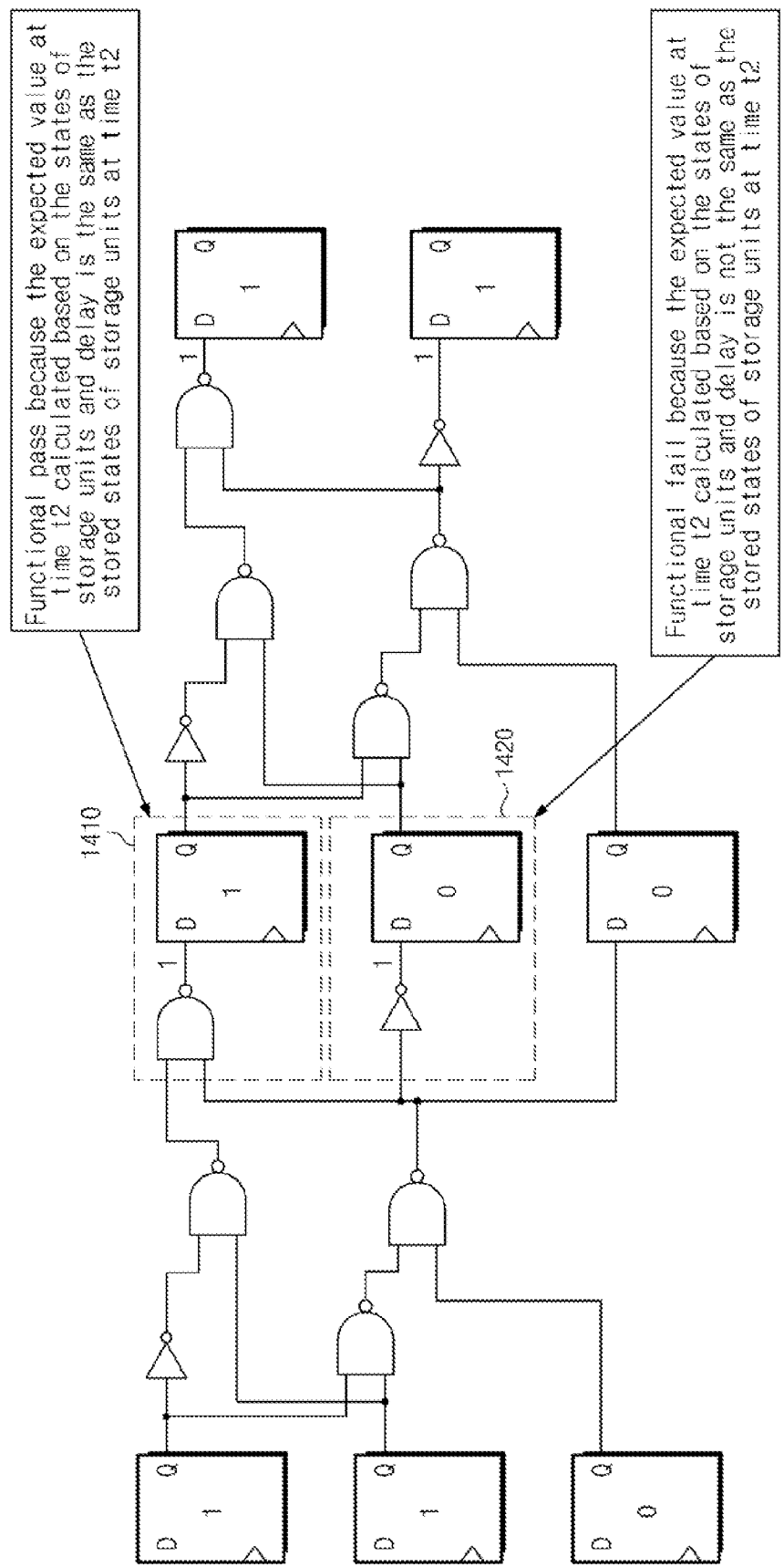
FIG. 14 shows schematic diagrams for functional and timing verification in distributed simultaneous simulation in accordance with an exemplary embodiment of the present disclosure.

Turning to FIG. 14, functional and timing verification in DSS In accordance with an exemplary embodiment of the present disclosure is indicated generally by the reference numeral 1400. Here, a functional pass occurs at storage unit 1410 because the expected value at time t2 calculated based on the states of storage units and delay is the same as the stored states of storage units at time t2. However, a functional fail occurs at storage unit 1420 because the expected value at time t2 calculated based on the states of storage units and delay is not the same as the stored states of storage units at time t2. Thus, after a start clock cycle t1, one can calculate an arrival delay to the next storage unit or units and know the expected value arrived at the next storage units, and then verify the functionality of the target circuit and verify the timing violation related to a setup and hold time at the next clock cycle t2.

Figure 15:
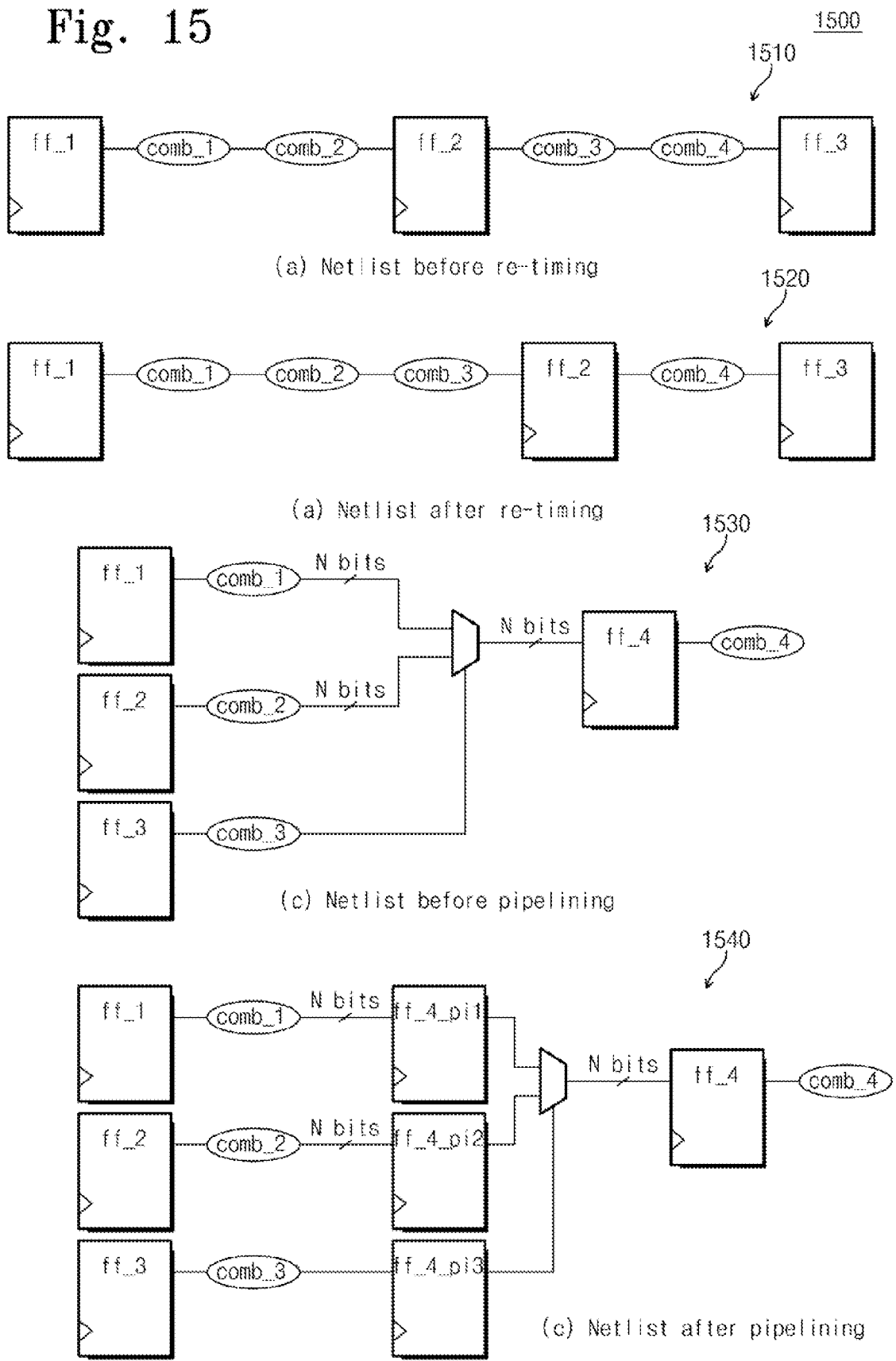
FIG. 15 shows schematic diagrams for netlist changes in functional verification in accordance with an exemplary embodiment of the present disclosure.

Turning now to FIG. 15, netlist changes in functional verification in accordance with an exemplary embodiment of the present disclosure are indicated generally by the reference numeral 1500. A netlist 1510 is shown before re-timing; and a netlist 1520 is shown after re-timing. A netlist 1530 is shown before pipelining; and a netlist 1540 is shown after pipelining. Thus, there may be several changes in netlist after synthesis or optimization by design tools. The changes may include re-timing to adjust a setup and hold timing margin, and pipelining to increase functional stability and performance. If there are some changes in the netlist, the functional verification may fail. DSS may detect the functional fail point and check the equivalence of final functionality related to the next storage units.

Figures 16, 16A:
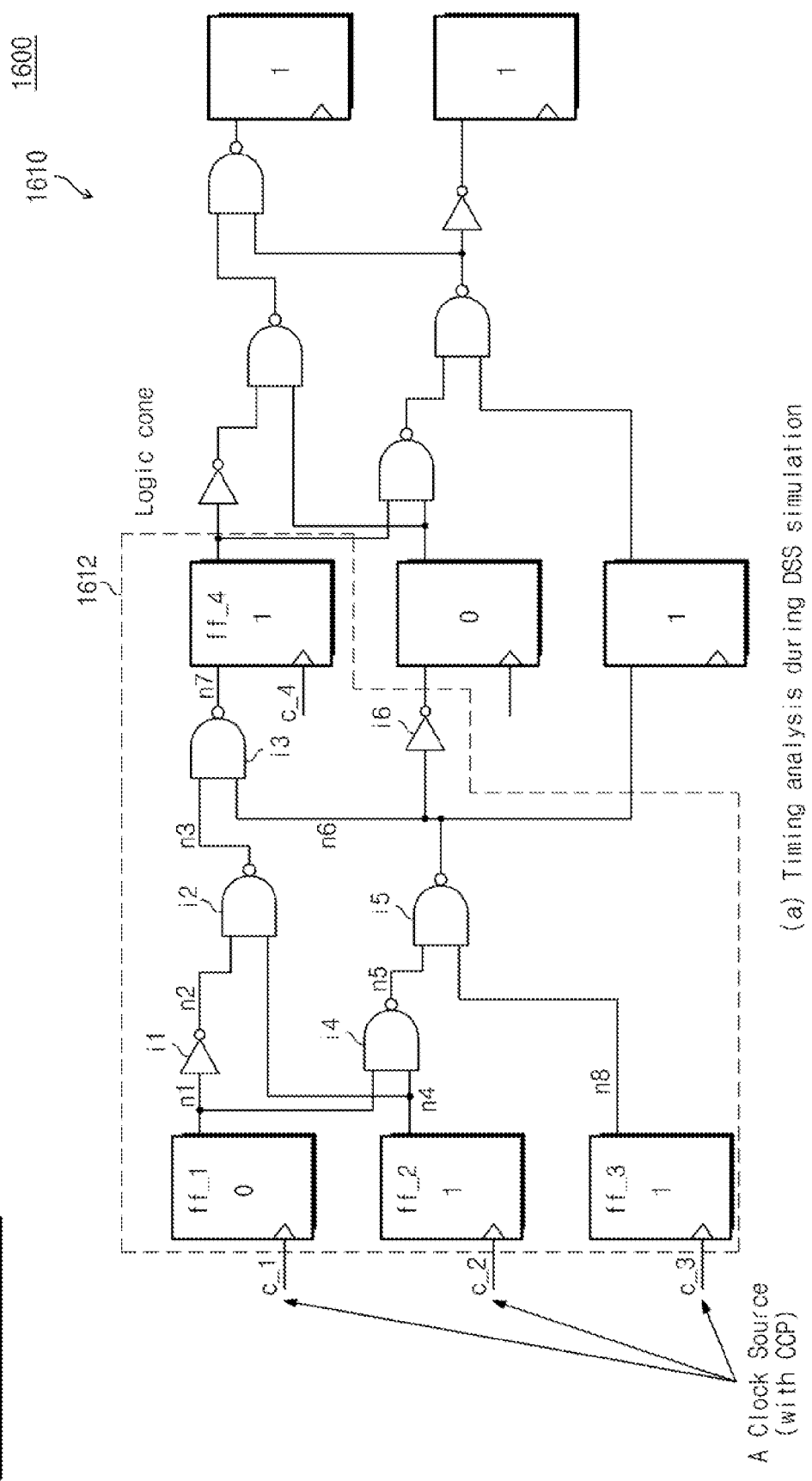
FIGS. 16A-16B show schematic diagrams for a dynamic timing analysis in accordance with an exemplary embodiment of the present disclosure.
Figure 16B:
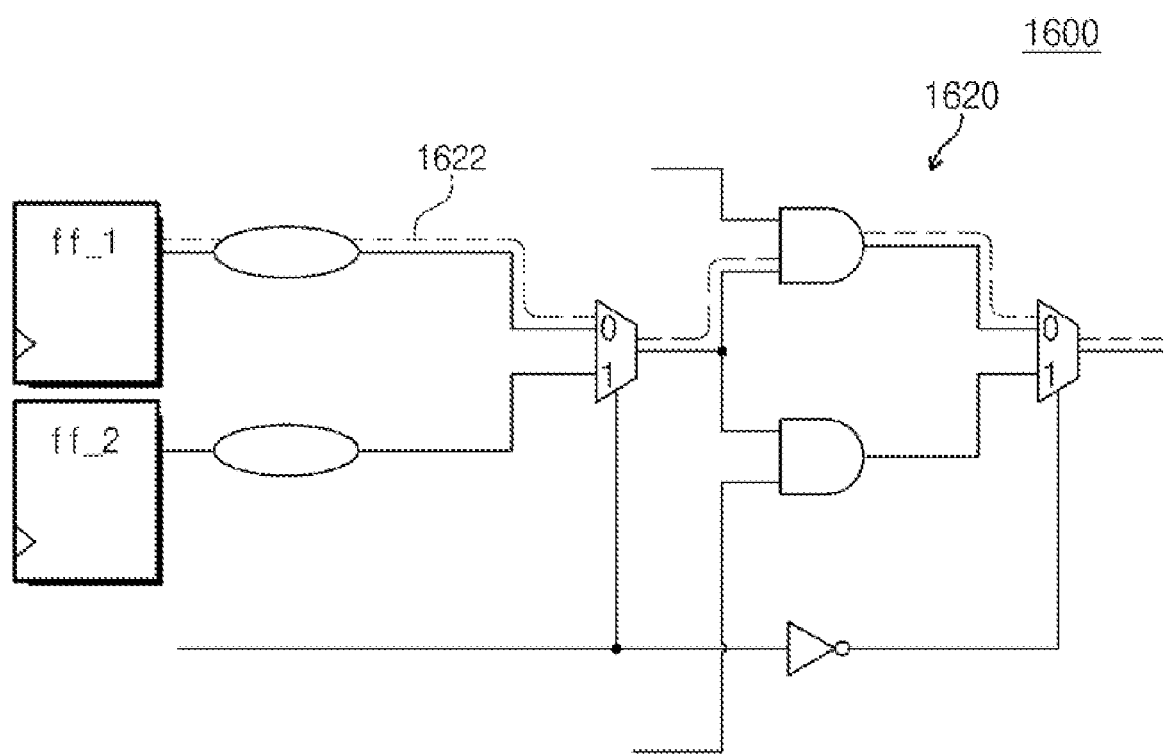

As shown in FIGS. 16A-16B a dynamic timing analysis in accordance with an exemplary embodiment of the present disclosure is indicated generally by the reference numeral 1600. A timing analysis 1610 is shown during a DSS simulation and includes a logic cone 1612 having a clock source with CCP. A circuit 1620 is shown with an overlaid logical false path 1622. Thus, DSS can make a timing analysis and analyze the path delay and save the result of the timing analysis during DSS simulation. DSS can report a best path or a worst path corresponding a logic cone based on the stored states of storage units in the logic cone using dynamic timing analysis.

DSS has no logical false path because all of the calculation is based on the real path in response to a real state of start storage units, such as ff_1, ff_2, and ff_3 of the logic cone 1612. If one wants to check additional stimulus out of the boundary of the dynamic stimulus generated for all of the simulation time, one can check all the stimulus like a normal static timing analysis (STA) technique by assigning all possible states of start storage units in a logic cone.

Figure 17B:
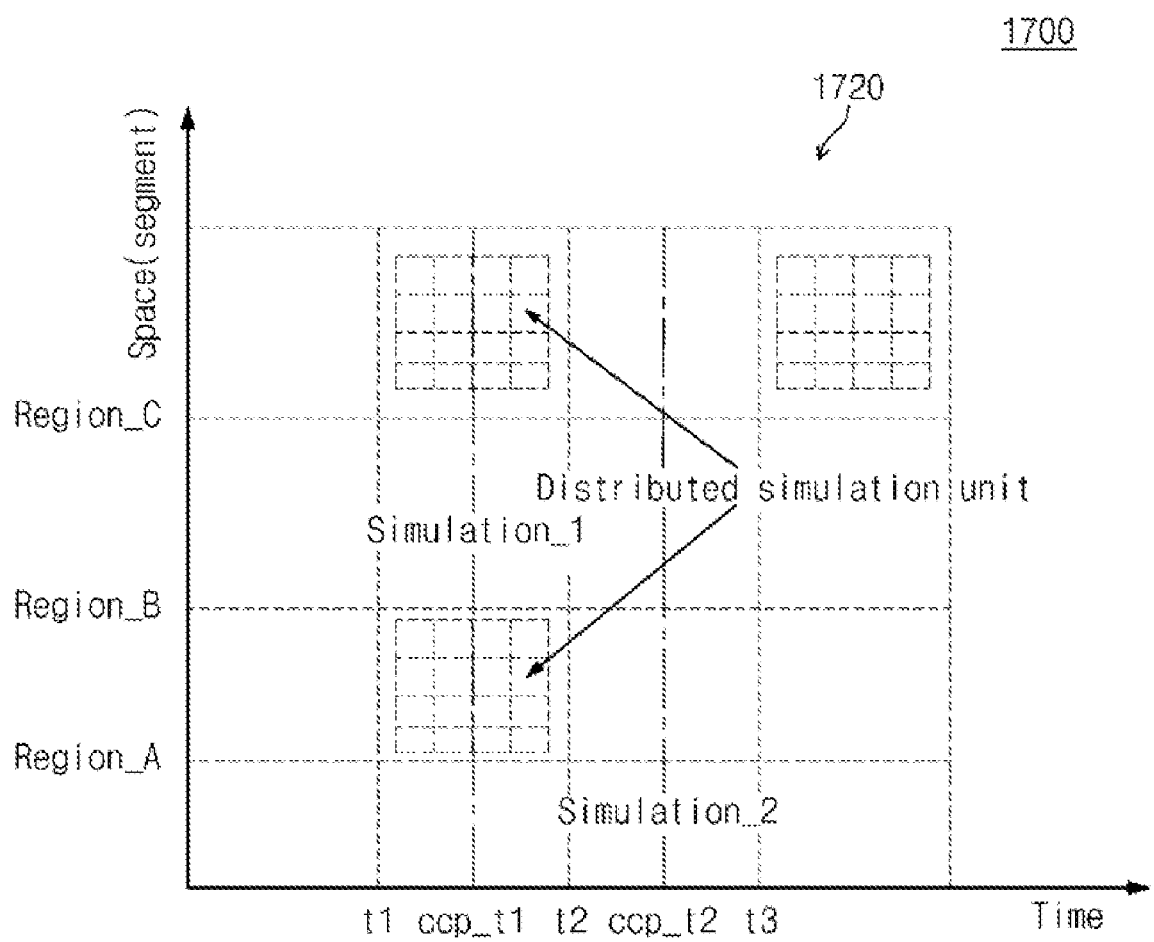

Turning to FIGS. 17A-17B, a distributed simulation with changes of clock source in accordance with an exemplary embodiment of the present disclosure is indicated generally by the reference numeral 1700. A plot 1710 shows changes of clock source at ccp_t1 and ccp_t2 during simulation. A plot 1720 shows DSS according to the clock changes at ccp_t1 and ccp_t2 during simulation. There may be clock changes during simulation in a clock source such as in a gated clock network or a multiplexed clock network at time ccp_t1 and ccp_t2, for example. If there are clock changes during DSS simulation, DSS starts a new successive distributed simulation with the previous states of storage units based on hard or semi-hard segments and independent logic regions.

A conventional power calculation takes a relatively long time to check all the changes of nets and storage elements at every clock cycle if the power calculation system has to check real power consumption. Further, a conventional average power calculation cannot report a real peak power or real power consumption based on the delay information of all nets and elements because it provides only average power information.

DSS embodiments of the present disclosure can check all of the changes of nets and storage elements and distribute the calculation over many CPUs or machines to reduce the calculation time for total power. Thus, it is much easier to report real peak power and sub block power consumption based on the delay information of all nets and elements for a small simulation time. The delay information may include cell delays and interconnection delays in a Standard Delay Format (SDF) file and RC values in a Standard Parasitic Format (SPF) file.

Figures 18, 18A:
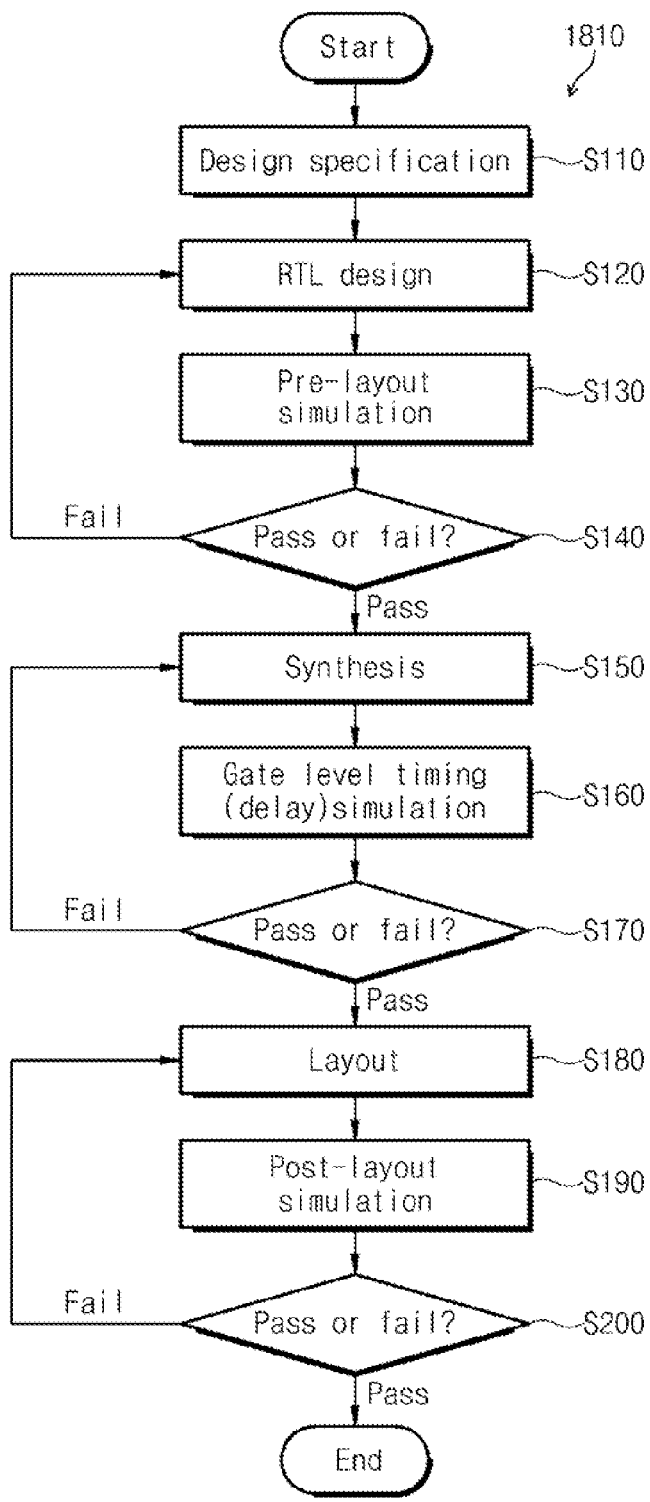
FIGS. 18A-18C show flow diagrams for methods of distributed simultaneous simulation in accordance with exemplary embodiments of the present disclosure.
Figure 18B:
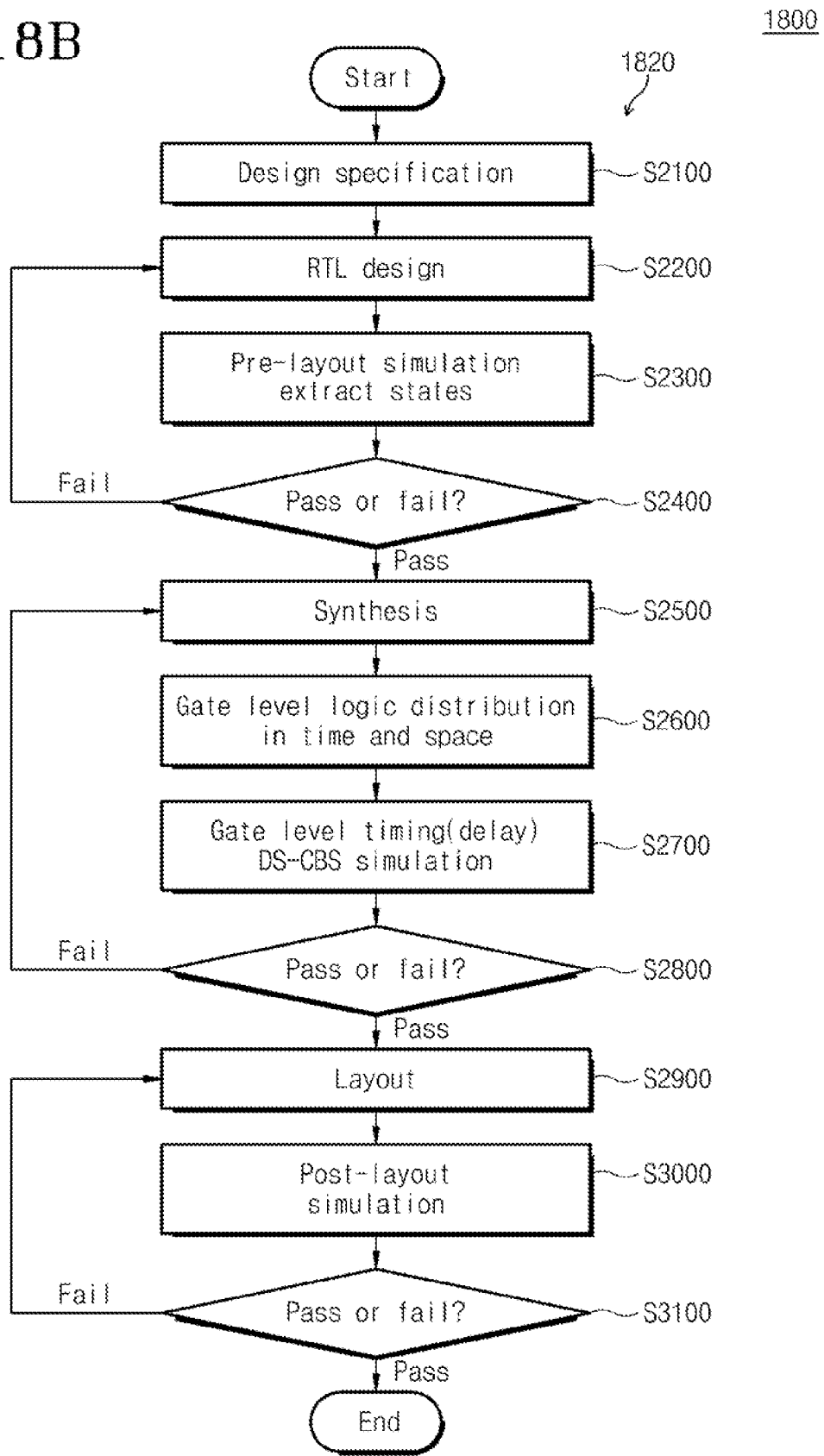
Figure 18C:
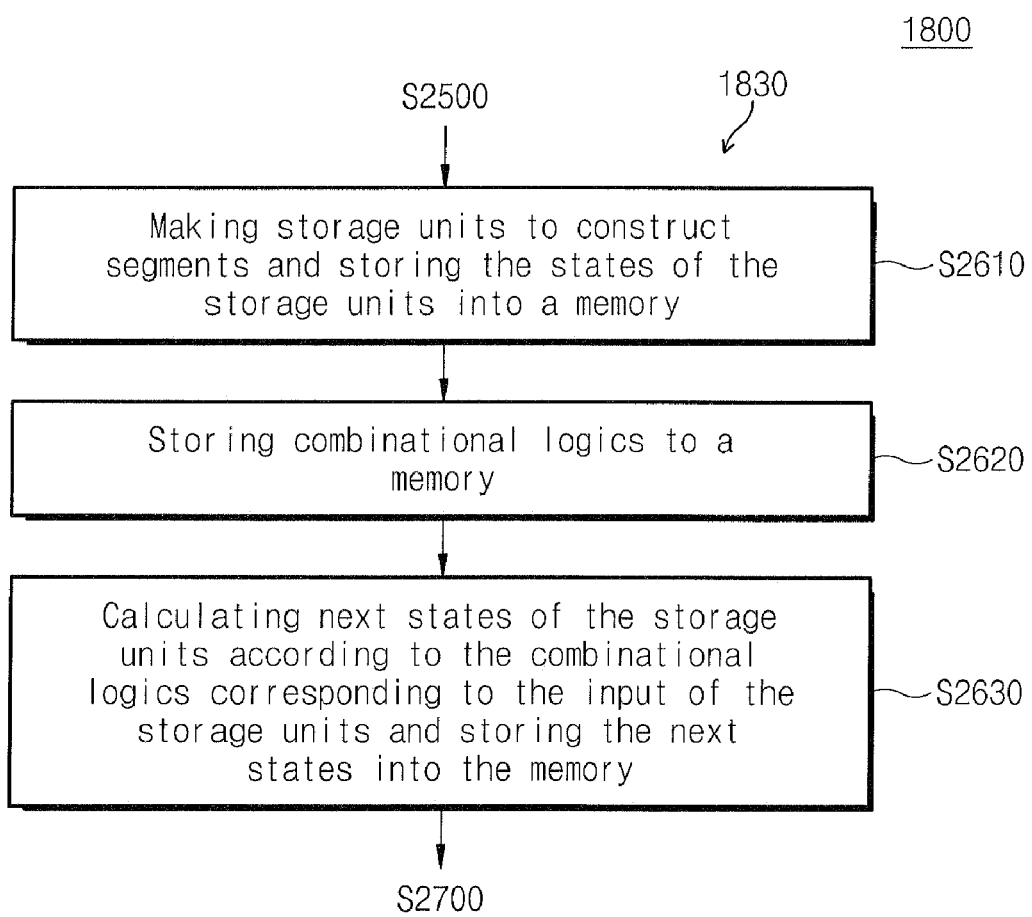

Turning now to FIGS. 18A-18C, flow diagrams in accordance with exemplary embodiments of the present disclosure are indicated generally by the reference numeral 1800. A primarily conventional flow is indicated by 1810. A DSS design flow is indicated by 1820. A high-level concept flow is indicated by 1830.

The high-level concept flow 1830 includes a step S2610 for making storage units to construct segments and storing the states of the storage units into a memory. The step S2610 passes control to a step S2620 for storing combinational logic to a memory. The step 2620, in turn, passes control to a step S2630 for calculating the next states of the storage units according to the combinational logics corresponding to the inputs of the storage units and storing the next states into the memory.

The DSS design flow 1820 includes a design specification step S2100 that passes control to an RTL design step S2200. The step S2200 pct a pre-layout simulation state extraction step S2300, which leads to a pass/fail decision block S2400. The extraction of states may be done either before or after the pre-layout or RTL simulation in the step S2300 If the design fails, control is passed back to the RTL design step S2200.

If the design passes, control is passed to a synthesis step S2500. The step S2500 leads to a step S2600 for gate-level logic distribution in time and space. The step S2600, in turn, passes control to a step S2700 for a DSS simulation of gate-level timing or delay. The step S2700 leads to a pass/fail decision block S2800. If the synthesis fails, control is passed back to the synthesis step S2500.

If the synthesis passes, control is passed to a layout step S2900. The step S2900 leads to a step S3000 for post-layout timing DSS simulation. The step S3000, in turn, leads to a pass/fail decision step S3100. If the layout fails, control is passed back to the layout step S2900. If the layout passes, control is passed to an end block.

Therefore, embodiments of the present disclosure can simulate or verify the target unit much faster than conventional methods by first dividing target logic into segments that operate independently in a pre-determined way, using the concepts of storage unit, hard segment, semi-hard segment, soft segment, Net Tracer, and independence in terms of space and time. The storage states may be saved at every clock cycle during pre-layout or zero delay, or post-layout simulation, or by hardware emulation. As an alternative, it shall be understood that the states need not be extracted at S2300, but may alternatively or additionally be extracted at S2700 or S3000.

The storage states may be used every clock cycle during pre-layout or zero delay, or post-layout simulation, to save simulation time. Embodiments distribute the digital circuit into independent simulation time units and independent circuit segments and reduce simulation time remarkably. In addition, embodiments make it easier to report a real peak power and sub block power consumption. Some embodiments use a memory model with pseudo flip-flops for the input and/or output ports of the memory, a feedback loop to store or restore states of the original storage units, and the like. Delay and function can be merged or done at the same time, unlike the prior art. In addition, a distributed simultaneous simulation can be based on stimulus.

These and other features and advantages of the present disclosure may be readily ascertained by one of ordinary skill in the pertinent art based on the teachings herein. It is to be understood that the teachings of the present disclosure may be implemented in various forms of hardware, software, firmware, special purpose processors, or combinations thereof. Moreover, the software is preferably implemented as an application program tangibly embodied in a program storage device. The application program may be uploaded to and executed by, a machine comprising any suitable architecture. Preferably, the machine is implemented on a computer platform having hardware such as one or more central processing units ("CPU,"), a random access memory ("RAM"), and input/output ("I/O") interfaces. The computer platform may also include an operating system and microinstruction code. The various processes and functions described herein may be either part of the microinstruction code or part of the application program, or any combination thereof which may be executed by a CPU. In addition, various other peripheral units may be connected to the computer platform such as an additional data storage unit and a display unit. The actual connections between the system components or the process function blocks may differ depending upon the manner in which the embodiment is programmed.

Although illustrative embodiments have been described herein with reference to the accompanying drawings, it is to be understood that the present invention is not limited to those precise embodiments, and that various other changes and modifications may be effected therein by one of ordinary skill in the pertinent art without departing from the scope or spirit of the present invention. All such changes and modifications are intended to be included within the scope of the present invention as set forth in the appended claims.

What is claimed is:

1. A method of simulating a circuit, the method comprising:
   providing a state of at least one storage unit;
   providing a segment of the circuit bounded by the at least one storage unit; and
   simulating the segment in accordance with the state of the at least one storage unit;
   wherein the at least one storage unit comprises a cell having a pseudo storage unit in each of its output ports.

2. A method as defined in claim 1, further comprising providing a model for the at least one storage unit.

3. A method as defined in claim 2, the step of providing a state comprising extracting the state from the at least one storage unit.

4. A method as defined in claim 2, the step of providing a state comprising restoring the state to the at least one storage unit.

5. A method as defined in claim 1, further comprising:
   modeling the at least one storage unit;
   restoring the state of the at least one storage unit through a feedback loop; and
   simulating the segment in accordance with the restored state.

6. A method as defined in claim 1, further comprising:
   receiving a model for a plurality of storage units of the circuit;
   identifying at least one segment separated by the plurality of storage units;
   restoring states of the plurality of storage units through at least one feedback loop; and
   simulating the segment in accordance with the restored states.

7. A method of simulating a circuit, the method comprising:
   receiving a segment having boundary storage units;
   restoring states of the storage units; and
   simulating the segment in accordance with the restored states;
   wherein the storage units comprise a cell having at least one pseudo storage unit in each of its output ports.

8. A method as defined in claim 1 wherein the circuit is digital.

9. A method as defined in claim 1 wherein the simulated segment is spatially and time-wise independent from other segments.

10. A method as defined in claim 1, further comprising distributing the circuit into independent circuit segments and independent simulation time units.

11. A method as defined in claim 1, further comprising simultaneously simulating other segments that are spatially and time-wise independent.

12. A method as defined in claim 1 wherein the segment shares at least one dependent connection with another segment, the method further comprising adding a pseudo storage unit in the at least one dependent connection to make the segment substantially independent for simulation purposes.

13. A method as defined in claim 12 wherein the pseudo storage unit is one of a pseudo flip-flop or latch, or a net tracer comprising a pseudo multiplexer in signal communication with a pseudo flip-flop or latch.

14. A method as defined in claim 13, the net tracer further comprising:
   an output of the pseudo multiplexer in signal communication with an input of the pseudo flip-flop or latch; and
   an input of the pseudo multiplexer bypassing the net tracer.

15. A method as defined in claim 13, further comprising providing a clock domain having a plurality of segments using the same clock.

16. A method as defined in claim 15, the clock domain having a clock control point monitored with a net tracer.

17. A method as defined in claim 1 wherein the segment is independently closed by at least one real storage unit.

18. A method as defined in claim 17 wherein the real storage unit is one of a real flip-flop or latch, or a storage tracer comprising a pseudo multiplexer in signal communication with a real flip-flop or latch.

19. A method as defined in claim 18, the storage tracer further comprising an output of the pseudo multiplexer in signal communication with an input of the real flip-flop or latch.

20. A method as defined in claim 1 wherein the storage unit is synchronous with a clock.

21. A method as defined in claim 1 wherein the step of simulating is cycle-based or event-driven.

22. A method as defined in claim 1 wherein the step of simulating is cycle-based with zero delay.

23. A method as defined in claim 22, the plurality of storage units comprising real and pseudo storage units.

24. A method as defined in claim 1 wherein the step of simulating is event-driven with delay.

25. A method as defined in claim 24, the at least one storage unit comprising a real storage unit.

26. A method as defined in claim 1, further comprising:
storing the state of the at least one storage unit as a feedback value; and
restoring the feedback value as a state for simulation.

27. A method as defined in claim 1 wherein the step of simulating comprises performing a delay simulation simultaneously with a functional simulation.

28. A method as defined in claim 4 wherein the step of restoring comprises restoring a received stimulus or an output from an emulator.

29. A method as defined in claim 1, further comprising:
identifying a time of a changed clock source;
defining a segment time-wise separated by the changed clock source; and
simulating the defined segment in accordance with the state of the at least one storage unit and changed clock source.

30. A method as defined in claim 1, further comprising calculating power consumption for each segment that is spatially or time-wise independent.

31. A method as defined in claim 30, further comprising at least one of:
reporting a peak power consumption for any segment of the circuit; or
reporting a peak power consumption for the circuit comprising all segments.

32. A method as defined in claim 1, the step of simulating comprising at least one of a zero delay simulation or a non-zero delay simulation.

33. A distributed simultaneous simulation system, comprising:
at least one memory for describing storage units of a circuit, maintaining states of the storage units, and identifying a plurality of distributed segments comprising combinational logic separated by the storage units; and
a plurality of processing units, each for simultaneously simulating at least one of the plurality of segments in accordance with the maintained states;
wherein the storage units comprise a cell having at least one pseudo storage unit in each of its output ports.

34. A system as defined in claim 33, further comprising a hardware emulator in signal communication with the memory for providing information indicative of the states of the storage units.

* * * * *